(12) United States Patent
Ozeki et al.

(10) Patent No.: US 11,393,803 B2
(45) Date of Patent: Jul. 19, 2022

(54) LIGHT EMITTING DEVICE

(71) Applicant: NICHIA CORPORATION, Anan (JP)

(72) Inventors: Kenji Ozeki, Tokushima (JP); Hiroki Fukuta, Anan (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 17/033,930

(22) Filed: Sep. 28, 2020

(65) Prior Publication Data

US 2021/0020621 A1    Jan. 21, 2021

Related U.S. Application Data

(60) Continuation of application No. 16/558,163, filed on Sep. 2, 2019, now Pat. No. 10,825,803, which is a
(Continued)

(30) Foreign Application Priority Data

Nov. 30, 2015 (JP) ................................. 2015-233593
Feb. 24, 2016 (JP) ................................. 2016-032573

(51) Int. Cl.
*H01L 25/16* (2006.01)
*H01L 33/52* (2010.01)
(Continued)

(52) U.S. Cl.
CPC ............ *H01L 25/167* (2013.01); *H01L 24/26* (2013.01); *H01L 24/73* (2013.01); *H01L 24/96* (2013.01);
(Continued)

(58) Field of Classification Search
CPC ... H01L 25/167; H01L 25/0753; H01L 33/56; H01L 33/60; H01L 33/62; H01L 24/97
See application file for complete search history.

(56) References Cited

U.S. PATENT DOCUMENTS 8,882,304 B2  11/2014  Wu et al.
9,202,999 B2  12/2015  Kawano et al.
(Continued)

FOREIGN PATENT DOCUMENTS

EP    2555262    2/2013
EP    2919285    9/2015
(Continued)

OTHER PUBLICATIONS

Restriction Requirement issued by the U.S. Patent and Trademark Office for the U.S. Appl. No. 15/364,267, dated Nov. 29, 2017.
(Continued)

*Primary Examiner* — Jose R Diaz
(74) *Attorney, Agent, or Firm* — Mori & Ward, LLP

(57) ABSTRACT

A light emitting device includes a substrate and a light emitting element mounted on the substrate, a light transmissive member, covering member, first and second protruding members, and a protective element. The light transmissive member is disposed on an upper surface of the light emitting element. The covering member covers an upper surface of the substrate, a lateral surface of the light emitting element, and at least a portion of a lateral surface of the light transmissive member such that an upper surface of the light transmissive member is exposed. The first protruding member and the second protruding member are provided on the substrate such that the light emitting element and the light transmissive member are positioned between the first protruding member and the second protruding member. The protective element is mounted on the substrate so as to be positioned between the light emitting element and the second protruding member.

10 Claims, 17 Drawing Sheets

Related U.S. Application Data division of application No. 15/364,267, filed on Nov. 30, 2016, now Pat. No. 10,461,065.

(51) Int. Cl.

| | | |
|---|---|---|
| *H01L 25/07* | (2006.01) | |
| *H01L 25/075* | (2006.01) | |
| *H01L 33/56* | (2010.01) | |
| *H01L 33/54* | (2010.01) | |
| *H01L 33/60* | (2010.01) | |
| *H01L 33/50* | (2010.01) | |
| *H01L 33/00* | (2010.01) | |
| *H01L 23/00* | (2006.01) | |
| *H01L 33/58* | (2010.01) | |
| *H01L 23/24* | (2006.01) | |
| *H01L 27/02* | (2006.01) | |
| *H01L 29/866* | (2006.01) | |
| *H01L 33/62* | (2010.01) | |

(52) U.S. Cl.
CPC .......... *H01L 24/97* (2013.01); *H01L 33/0095* (2013.01); *H01L 33/52* (2013.01); *H01L 33/54* (2013.01); *H01L 33/56* (2013.01); *H01L 33/58* (2013.01); *H01L 33/60* (2013.01); *H01L 23/24* (2013.01); *H01L 25/072* (2013.01); *H01L 25/0753* (2013.01); *H01L 27/0248* (2013.01); *H01L 29/866* (2013.01); *H01L 33/505* (2013.01); *H01L 33/62* (2013.01); *H01L 2224/16227* (2013.01); *H01L 2224/26155* (2013.01); *H01L 2224/26175* (2013.01); *H01L 2224/32225* (2013.01); *H01L 2224/73204* (2013.01); *H01L 2224/73253* (2013.01); *H01L 2224/92225* (2013.01); *H01L 2224/97* (2013.01); *H01L 2924/12035* (2013.01); *H01L 2924/12041* (2013.01); *H01L 2924/1304* (2013.01); *H01L 2924/1426* (2013.01); *H01L 2924/1811* (2013.01); *H01L 2924/19105* (2013.01); *H01L 2933/005* (2013.01); *H01L 2933/0033* (2013.01); *H01L 2933/0041* (2013.01); *H01L 2933/0091* (2013.01)

(56) References Cited

U.S. PATENT DOCUMENTS

| | | | | |
|---|---|---|---|---|
| 10,825,803 B2* | 11/2020 | Ozeki | ................. | H01L 33/0095 |
| 2012/0104452 A1* | 5/2012 | Miyoshi | ............. | H01L 25/0753 |
| | | | | 257/99 |
| 2012/0235169 A1 | 9/2012 | Seko et al. | | |
| 2012/0319563 A1 | 12/2012 | Ishihara et al. | | |
| 2014/0027795 A1 | 1/2014 | Reiherzer et al. | | |
| 2014/0131753 A1 | 5/2014 | Ishida et al. | | |
| 2014/0362570 A1 | 12/2014 | Miyoshi et al. | | |
| 2015/0262987 A1 | 9/2015 | Wada et al. | | |
| 2015/0275073 A1 | 10/2015 | Wada | | |
| 2016/0240746 A1 | 8/2016 | Yun et al. | | |
| 2018/0138377 A1 | 5/2018 | Senuki et al. | | |
| 2018/0195675 A1 | 7/2018 | Miyoshi et al. | | |

FOREIGN PATENT DOCUMENTS

| | | |
|---|---|---|
| JP | 2010-157638 | 7/2010 |
| JP | 5521325 B2 | 7/2010 |
| JP | 2012-059939 | 3/2012 |
| JP | 2013-004807 | 1/2013 |
| JP | 2013-051375 | 3/2013 |
| JP | 2013-143496 | 7/2013 |
| JP | 2013-219260 | 10/2013 |
| JP | 2014-112635 | 6/2014 |
| JP | 2014-154803 | 8/2014 |
| JP | 2014-236175 | 12/2014 |
| JP | 2015-103632 | 6/2015 |
| JP | 2015-188053 | 10/2015 |
| JP | 2015-189908 | 11/2015 |
| WO | WO 2013/024428 | 2/2013 |
| WO | WO 2013/118076 | 8/2013 |
| WO | WO 2017/013870 | 1/2017 |

OTHER PUBLICATIONS

Office Action with Form PTO-892 Notice of References Cited issued by the U.S. Patent and Trademark Office for the U.S. Appl. No. 15/364,267, dated May 11, 2018.

Office Action with Form PTO-892 Notice of References Cited issued by the U.S. Patent and Trademark Office for the U.S. Appl. No. 15/364,267, dated Oct. 2, 2018.

Office Action with Form PTO-892 Notice of References Cited issued by the U.S. Patent and Trademark Office for the U.S. Appl. No. 15/364,267, dated Jan. 7, 2019.

Advisory Action issued by the U.S. Patent and Trademark Office for the U.S. Appl. No. 15/364,267, dated Apr. 23, 2019.

Notice of Allowance issued by the United States Patent and Trademark Office for the U.S. Appl. No. 15/364,267, dated Jun. 5, 2019.

Office Action with Form PTO-892 Notice of References Cited issued by the U.S. Patent and Trademark Office for the parent U.S. Appl. No. 16/558,163, dated Mar. 30, 2020.

Notice of Allowance issued by the United States Patent and Trademark Office for the parent U.S. Appl. No. 16/558,163, dated Jul. 14, 2020.

* cited by examiner

LIGHT EMITTING DEVICE

CROSS REFERENCE TO RELATED APPLICATION

The present application is a continuation application of the U.S. patent application Ser. No. 16/558,163, filed Sep. 2, 2019, which is a divisional application of the U.S. patent application Ser. No. 15/364,267 filed Nov. 30, 2016, which was issued as the U.S. Pat. No. 10,461,065, which claims priority to Japanese Patent Application Nos. 2015-233593 filed on Nov. 30, 2015 and 2016-032573 filed on Feb. 24, 2016. The disclosures of these applications are hereby incorporated by reference in their entireties.

BACKGROUND

Field

The present invention relates to a light emitting device.

Description of the Related Art

Light emitting diodes (LEDs) attracting attention as a next-generation light source has good energy saving effect compared with that in conventional light sources, and can be used for a long time. For this reason, application of light emitting diodes for such as backlights, automobiles, electronic display boards, traffic signal lamps, and general lighting lamps have been spreading industry-wide.

Examples of light emitting devices using LEDs include a light emitting device in which light emitting elements are mounted on a mount substrate having wirings (for example, see Japanese Patent Application Publication No. 2014-112635). Such light emitting devices are manufactured efficiently as follows; that is, light emitting elements are mounted on one collective substrate having a size of a plurality of substrates and are covered with a resin member, and then the resin member and the collective substrate are cut and singulated.

In Japanese Patent Application Publication No. 2014-112635, a light emitting device includes, on a substrate, light emitting elements, a phosphor layer arranged above the light emitting elements and made of a light transmissive member containing phosphors for converting wavelength of light from the light emitting elements, and a reflective resin arranged adjacent to side surfaces of the phosphor layer and lateral surfaces of the light emitting elements in order to obtain high front luminance.

Further, Japanese Patent Application Publication No. 2014-112635 discloses that the light emitting device is manufactured in the steps as described below. First, a plurality of light emitting elements are arranged in matrix on a collective substrate having a size corresponding to a plurality of substrates, and semiconductor elements such as protective elements are arranged between the light emitting elements. Subsequently, a phosphor layer is arranged on the light emitting elements, and then, lateral surfaces of the light emitting elements and the phosphor layer are covered by a reflective resin. Thereafter, the reflective resin and the collective substrate are cut between the light emitting elements and the semiconductor elements, so that the light emitting devices are singulated. Further, in Japanese Patent Application Publication No. 2014-112635, a liquid resin is filled around the light emitting elements, the phosphor layer and the semiconductor elements by a resin-discharging device, and then, heating is performed to cure the resin, so that the reflective resin is formed.

SUMMARY

According to one aspect of the present invention, a light emitting device includes a substrate, a light emitting element, a light transmissive member, a covering member, a first protruding member, a second protruding member, and a protective element. The light emitting element is mounted on the substrate. The light transmissive member is disposed on an upper surface of the light emitting element. The covering member covers an upper surface of the substrate, a lateral surface of the light emitting element, and at least a portion of a lateral surface of the light transmissive member such that an upper surface of the light transmissive member is exposed. The first protruding member is provided on the substrate. The second protruding member is provided on the substrate such that the light emitting element and the light transmissive member are positioned between the first protruding member and the second protruding member. The protective element is mounted on the substrate so as to be positioned between the light emitting element and the second protruding member.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE PREFERRED EMBODIMENTS

Figure 1A:
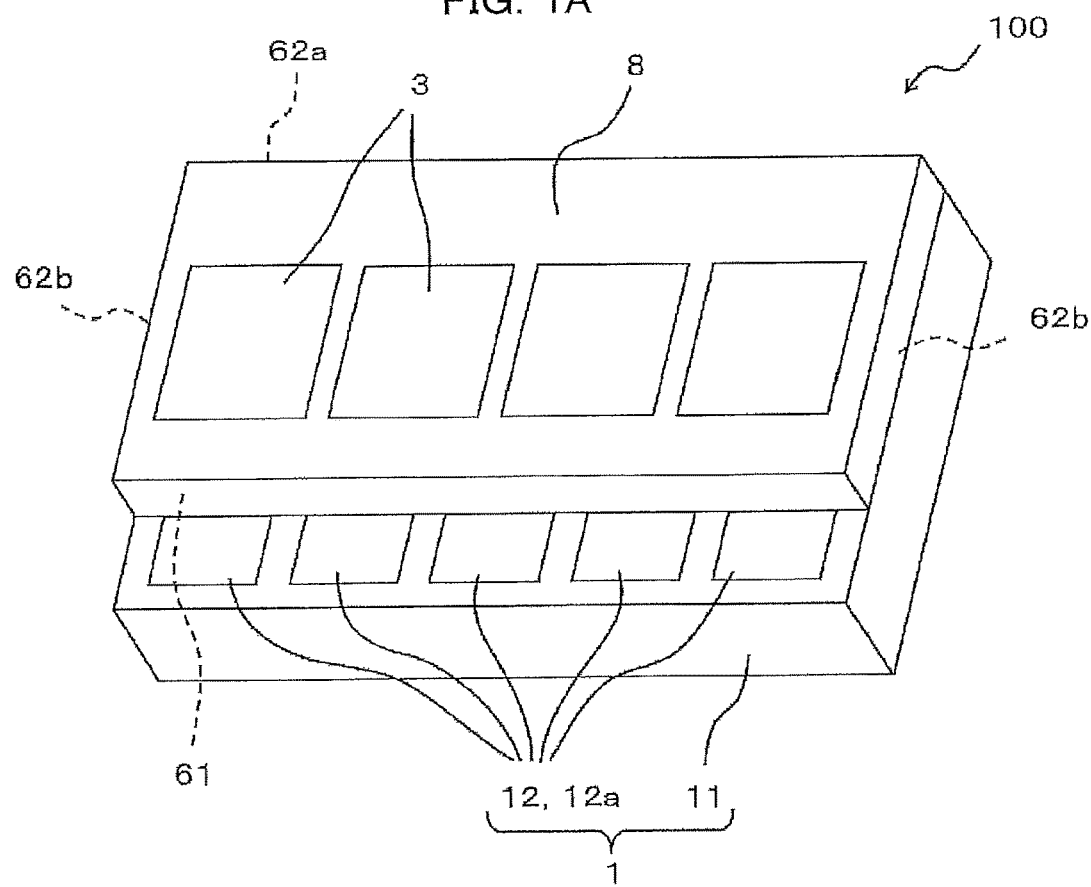
FIG. 1A is a schematic perspective view showing a structure of a light emitting device according to a first embodiment.

The embodiment(s) will now be described with reference to the accompanying drawings, wherein like reference numerals designate corresponding or identical elements throughout the various drawings.

Hereinafter, a description will be given of a light emitting device according to embodiments with reference to accompanying drawings.

Note that a scale of each member and positional relationships of members or the like in each drawing may be exaggerated for clarity of description. Further, in plan views and corresponding cross-sectional views, the scale and positional relationship of each member may not exactly coincide. Still further, in the descriptions below, the same names and reference numerals basically indicate the same or similar members, and the detailed description thereof may be omitted appropriately.

First Embodiment

Structure of Light Emitting Device

A structure of a light emitting device according to a first embodiment will be described with reference to FIGS. 1A to 1D.

Figure 1B:
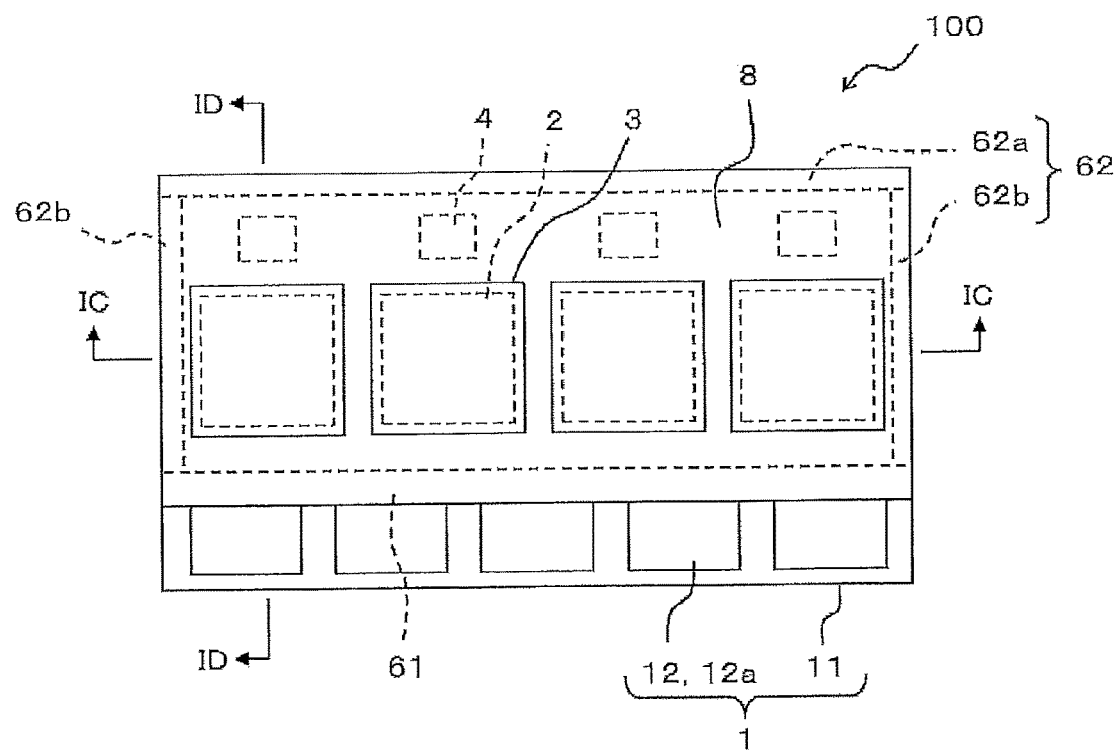
FIG. 1B is a schematic plan view showing a structure of the light emitting device according to the first embodiment.
Figure 1C:
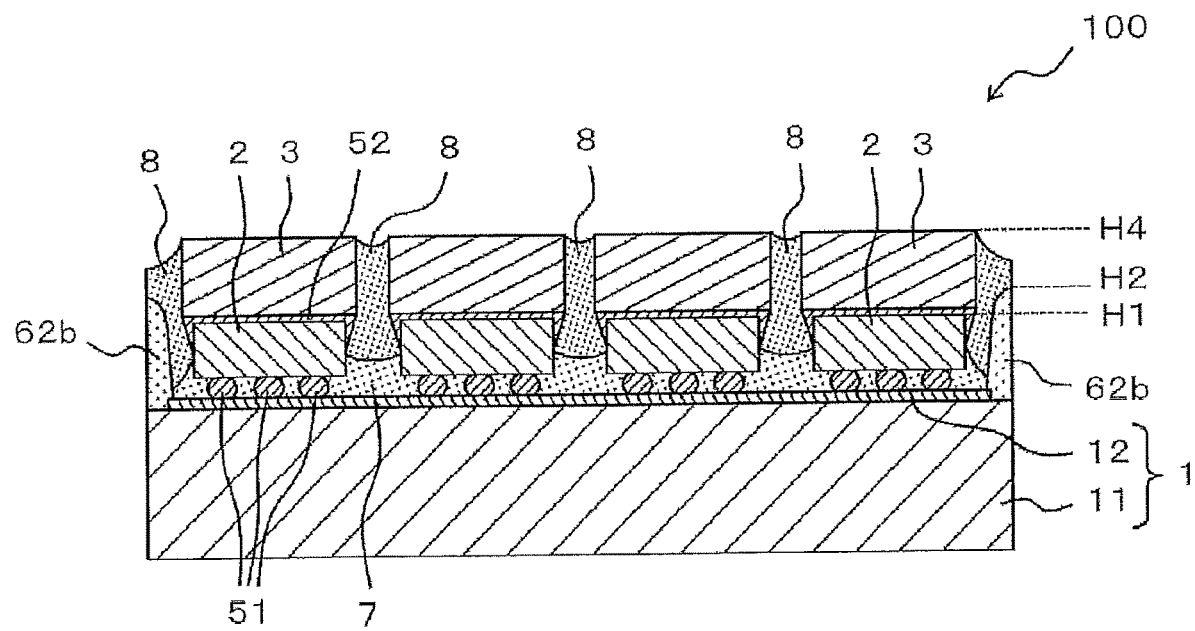
FIG. 1C is a schematic cross-sectional view showing a structure of the light emitting device according to the first embodiment taken along line IC-IC in FIG. 1B.
Figure 1D:
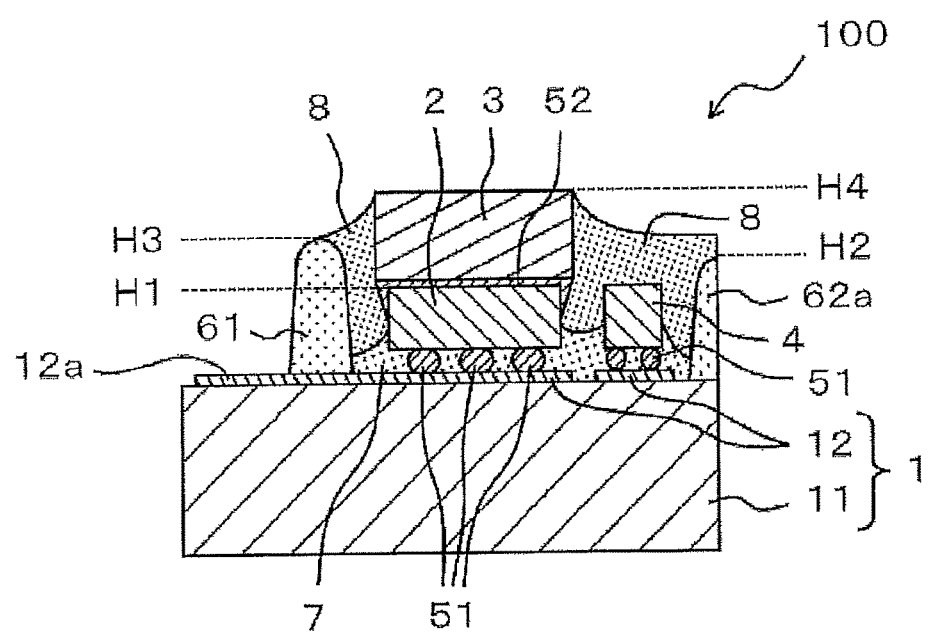
FIG. 1D is a schematic cross-sectional view showing a structure of the light emitting device according to the first embodiment taken along line ID-ID in FIG. 1B.

FIG. 1A is a schematic perspective view showing a structure of the light emitting device according to the first embodiment. FIG. 1B is a schematic plan view showing the structure of the light emitting device according to the first embodiment. FIG. 1C is a schematic cross-sectional view showing the structure of the light emitting device according to the first embodiment taken along a line IC-IC in FIG. 1B. FIG. 1D is a schematic cross-sectional view showing the structure of the light emitting device according to the first embodiment taken along a line ID-ID in FIG. 1B.

A light emitting device 100 according to the first embodiment mainly includes: a flat plate-shaped mount substrate 1 having substantially a rectangular shape in a plan view; four light emitting elements 2 mounted on an upper surface of the mount substrate 1 and having substantially a rectangular shape in a plan view; four light transmissive members 3 arranged on an upper surface of each light emitting element 2 and having substantially a rectangular shape in a plan view; and a cover member 8 arranged on an upper surface of the mount substrate 1 and covering lateral surfaces of each of the light emitting elements 2 and the light transmissive members 3. The light emitting device 100 has a substantially rectangular parallelepiped outer shape, and the upper surface of the mount substrate 1 includes a portion where the cover member 8 is not arranged, at which external connecting portions 12a serving as terminals for connecting with an external power source are arranged.

In a plan view, at peripheries of the cover member 8 having a substantially rectangular shape, a first protruding member 61 is arranged on one side of the rectangular shape, and second protruding member 62 is arranged on the other three sides of the rectangular shape. In other words, in FIG. 1B, of peripheries of the substantially rectangular shape of cover member 8, the first protruding member 61 is arranged on a lower side, a second protruding member 62*a* is arranged on an upper side, and second protruding members 62*b* are arranged on a right side and a left side. The cover member 8 is made of a light shielding material, preferably a light reflective resin, and upper surfaces of the light transmissive members 3 serve as a light extraction surface of the light emitting device 100 (i.e., light emitting surface of the light emitting device 100).

The light emitting device 100 according to the first embodiment includes a plurality of light emitting elements 2, and one light transmissive member 3 is arranged on an upper surface of each of a plurality of light emitting elements 2. That is, the light emitting device 100 includes a plurality of light emitting surfaces, and the cover member 8 is arranged between a plurality of light transmissive members 3 in a planar view. With this arrangement, light leakage between adjacent light emitting surfaces that may occur when a plurality of the light emitting elements 2 are individually turned on can be reduced. In the description below, each member is illustrated in detail.

Mount Substrate

The mount substrate 1 includes a flat plate-shaped support member 11 and a wiring 12 arranged on an upper surface of the support member 11, and the wiring 12 is arranged so as to mount the light emitting elements 2 and protective elements 4 thereon and to form a predetermined electric circuits. Portions of the wiring 12 are exposed from the cover member 8, and the exposed portions serves as external connection portions 12*a*, which are terminals for externally connecting the exposed portion. In the present embodiment, five external connecting portions 12*a* are arranged, and the wiring 12 is arranged such that the four light emitting elements 2 mounted on the mount substrate 1 can be driven individually by controlling voltage applied to these external connection portions 12*a*.

The support member 11 is preferably made of an insulating material that does not easily transmit light emitted from the light emitting elements 2 and external light. Further, a material having a certain degree of strength is preferably used. Examples of such material include ceramics such as alumina, aluminum nitride and mullite, and a resin such as phenol resin, epoxy resin, polyimide resin, bismaleimide triazine resin (BT resin) and polyphthalamide (PPA). Further, at least a portion of the upper surface of the support member 11 where the light emitting elements 2 are mounted preferably has good light reflectivity, and for example, a light reflective layer may be arranged made of a metal such as Ag and Al, or a white resin containing a white pigment. The wiring 12 is arranged on the upper surface of the support member 11, and may be made, for example, of a metal such as Cu, Ag, Au, Al, Pt, Ti, W, Pd, Fe and Ni or an alloy of these. Such wiring 12 may be formed by electrolytic plating, electroless plating, vapor deposition, sputtering or the like. Further, for example, in the case where Au bumps are used for mounting of the light emitting elements 2, using Au for an outermost layer of the wiring allows for enhancing bonding property between the wiring and the light emitting elements.

One or more light emitting elements 2 can be mounted on the mount substrate 1. Further, even in the case where a plurality of light emitting elements 2 are mounted, the wiring 12 includes, for example, two external connection portions 12*a* as a pair of wiring patterns, and the plurality of light emitting elements 2 may be connected in series or in parallel between the two external connection portions 12*a*.

Light Emitting Element

Each of the light emitting element 2 has, for example, a substantially rectangular shape in a plan view, and includes a light transmissive substrate, a semiconductor layered body, and a plurality of electrodes on a surface of the semiconductor layered body. Each of the light emitting element 2 preferably includes a pair of positive and negative electrodes on the same side. With this arrangement, the light emitting elements 2 can be flip-chip mounted on the mount substrate 1. In this case, a surface of each of the light emitting elements 2 opposite to the surface having the pair of electrodes is a main light extraction surface of each of the light emitting elements. Also, in the case where the light emitting elements 2 are face-up mounted on the mount substrate 1, the surface of each of the light emitting elements 2 having the pair of electrodes is a main light extraction surface of the light emitting element.

The light emitting elements 2 each having any wavelength may be used. For example, for a blue or green light emitting element 2, ZnSe, a nitride semiconductor ($In_XAl_YGa_{1-X-Y}n$, $0 \leq X$, $0 \leq Y$, $X+Y \leq 1$), or GaP may be used. For a red light emitting element 2, a nitride semiconductor represented by GaAlAs, AlInGaP may be suitably used. Further, a semiconductor light emitting element made of other materials may be used. A composition, emission color, size and the number of light emitting elements 2 to be used may be properly selected in accordance with purpose.

Light Transmissive Member

The light transmissive member 3 is bonded on the upper surface of the light emitting element 2 using a bonding member 52 having alight transmissive property. The light transmissive member 3 is made of a material that can transmit light emitted from the light emitting element 2 to extract outside. Further, the lateral surfaces of the light transmissive member 3 are covered by the cover member 8, and in the case where the cover member 8 has a light-shielding property, the upper surface of the light transmissive member 3 serves as a light extraction surface (light emitting surface) of the light emitting device 100.

In the present embodiment, in a plan view, the light transmissive member 3 has a plan view of a substantially rectangular shape that is larger than that of the light emitting element 2, and is arranged to cover a region where the light emitting element 2 is arranged. Further, while the upper surface of the light transmissive member 3 may have a lens shape, the upper surface of the light transmissive member 3 is preferably has a plate shape, which allows the cover member 8 covering the lateral surfaces of the light-transmissive member not to easily extend upward. A lens may be arranged on the upper surface of a plate-shaped light emitting member 3. In addition, a light transmissive member, for example, smaller than the light emitting element 2 in a planar view may be used.

The light transmissive member 3 may contain a light diffusion material or a wavelength conversion substance (e.g., phosphor) configured to convert at least a portion of the light emitted from the light emitting element 2 into light having a different wavelength. Examples of the light transmissive member 3 containing a wavelength conversion substance include a sintered body of a phosphor and a resin, a glass, other inorganic materials, etc., in which phosphor particles are contained. A sintered body of a phosphor may be formed by sintering only a phosphor, or by sintering a mixture of a phosphor and a sintering aid. In the case of sintering a mixture of a phosphor and a sintering aid, an inorganic material may be preferably used such as silicon oxide, aluminum oxide, or titanium oxide for the sintering aid. With this arrangement, even in the case where the light emitting element 2 is configured to emit light of high output, discoloration and deformation of the sintering aid due to light or heat can be suppressed.

The higher the light-transmittance of the light transmissive member 3, the more preferable. The light transmissive member 3 may have any appropriate thickness, and the thickness can be in a range of, for example, about 50 to 300 μm.

For the phosphor, a phosphor used in this field may be selected appropriately. For example, examples of a phosphor that can excite a blue-light emitting element or an ultraviolet-light emitting element include an yttrium-aluminum-garnet-based phosphor (Ce: YAG) activated with cerium, a lutetium-aluminum-garnet-based phosphor (Ce: LAG) activated with cerium, a nitrogen-containing aluminosilicate calcium-based phosphor ($CaO-Al_2O_3-SiO_2$) activated with europium and/or chromium, a silicate-based phosphor $((Sr, Ba)_2SiO_4)$ activated with europium, a nitride-based phosphor such as a β-sialon phosphor, a CASN-based phosphor, and a SCASN-based phosphor, a KSF-based phosphor ($K_2SiF_6$: Mn), a sulfide-based phosphor, a quantum dot phosphor, and the like. Combination of these phosphors and a blue light emitting element or an ultraviolet light emitting element allows for manufacturing a light emitting device emitting light for emitting various colors (for example, a light emitting device configured to emit light in a white-based color). In the case where the light emitting device 100 is configured to emit white light, a type and concentration of a phosphor contained in the light transmissive member 3 can be adjusted so as to obtain white light. The concentration of a phosphor contained in the light transmissive member 3 is, for example, in a range of about 5 to 50 wt %. For a light diffusion material that can be contained in the light transmissive member 3, for example, titanium oxide, barium titanate, aluminum oxide, silicon oxide or the like may be used.

Protective Element

The light emitting device 100 may include a semiconductor element (for example, a protective element) different from the light emitting element 2. The protective element 4 is arranged to protect the light emitting element 2 against electrostatic discharge. A Zener diode may be suitably used for the protective element 4. One protective element 4 may be arranged for each of the light emitting elements 2, or only one protective element 4 may be arranged for the light emitting device 100. Further, the protective element 4 may not be arranged in accordance with application of the light emitting device.

In the case where semiconductor elements other than the light emitting elements 2 such as the protective elements 4 and/or a transistor for controlling driving of the light emitting elements 2 are arranged on the mount substrate 1, the semiconductor elements other than the light emitting elements 2 are preferably arranged between the light emitting elements 2 and the first protruding member 61 or the second protruding member 62. In particular, such semiconductor elements can be arranged at a portion most distant from the light transmissive member 3 from the first protruding member 61 or the second protruding member 62, which allows a level of an uncured resin material for forming the cover member 8 can be effectively prevented from being lowered at the time of forming the cover member 8.

Bonding Member

The bonding member 51 is a conductive member for mechanically and electrically connecting the light emitting elements 2 to the wiring 12 arranged on the upper surface of the mount substrate 1. In the case where the light emitting elements 2 are flip-chip mounted on the mount substrate 1, metal bumps such as wire bumps or plated bumps which are made of a metal material such as Au, Ag, Cu, Al may be used for the bonding member 51. The metal bumps may be arranged so as to be bonded to an n-side electrode and a p-side electrode of each of the light emitting elements 2 or to the wirings 12 in advance, before the light emitting elements 2 are bonded on the mount substrate 1. In this case, the light emitting element 2 may be bonded on the mount substrate 1 by an ultrasonic bonding method. In addition, for the bonding member 51, a solder such as an AuSn-based alloy solder, an Sn-based lead-free solder, etc., may be used. In this case, the light emitting element 2 may be bonded on the mount substrate 1 by a reflow method. Further, for the bonding member 51, a conductive adhesive in which conductive particles are contained in resin may be used. Still further, in the case where the light emitting elements 2 are each face-up mounted on the mount substrate 1, a conductive member may not be used for bonding the light emitting element 2 on the mount substrate 1, and the light emitting elements 2 may be bonded on the mount substrate 1 using a light transmissive resin such as a silicon resin. In this case, the plurality of electrodes of the light emitting element 2 is electrically connected to the wiring 12 by conductive wires or the like.

The bonding member 52 serves to bond the light transmissive member 3 on the upper surface of each of the light emitting elements 2. The bonding member 52 preferably has light transmissive property, and for the bonding member 52, an organic adhesive such as a silicon resin and an epoxy resin or an inorganic adhesive such as a low melting point glass may be used. Further, the bonding member 52 may be arranged on not only the upper surface of each of the light emitting elements 2 but also the side surfaces of each of the light emitting elements 2, which allows light emitted from the lateral surfaces of each of the light emitting elements 2 to enter the light transmissive member 3 via the bonding member 51, so that light extraction efficiency can be increased.

For the bonding between the light emitting elements 2 and the light transmissive member 3, direct bonding, for example, using the direct bonding method such as pressure bonding, sintering, a hydroxyl bonding method, a surface activation bonding method, or an atomic diffusion bonding method may be employed.

First Protruding Member

On the upper surface of the mount substrate 1, the first protruding member 61 forms one side of a substantially rectangular shape of the cover member 8 having the substantially rectangular shape in a plan view. More specifically, in FIG. 1B, the first protruding member 61 is arranged at a lower side of approximately rectangular shape of the cover member 8 in a plan view. As shown in FIGS. 1C and 1D, the first protruding member 61 is formed so that a position H3 of an upper end of the first protruding member 61 in a height direction is higher than a position H1 of the upper surface of the light emitting element 2 in the height direction and the position H3 is higher than a position H2 of an upper end of the second protruding member 62 in the height direction. Further, in, the position H3 of the upper end of the first protruding member 61 in the height direction is lower than a position H4 of an upper surface of the light transmissive member 3 in the height direction. With the first protruding member 61 having such structure, at the time of arranging the cover member 8 between the first protruding member 61 and the light transmissive member 3, the cover member 8 can be prevented from extending on the upper surface of the light transmissive member and blocking light emission.

The first protruding member 61 may be made of a resin material. For the resin material, a thermosetting resin such as an epoxy resin or a silicon resin may be used. Further, a resin material forming the first protruding member 61 may be a transparent resin, and for a light shielding substance, a white resin containing a light reflecting substance such as a white pigment or a black resin containing a light absorbing substance such as a black pigment may be used.

The first protruding member 61 is a portion of a frame body arranged on the collective substrate, which is an aggregate of a plurality of mount substrates 1, so as to surround a region where a plurality of light emitting elements 2 are arranged. The first protruding member 61 serves as a frame body for preventing an uncured liquid resin material from spreading at the time of forming the cover member 8, and is formed to be adhered to the cover member 8.

Second Protruding Member

The second protruding member 62 is, as shown in FIG. 1B, arranged on the upper surface of the mount substrate 1 at the upper side, the right side and the left side of the substantially rectangular shape of the cover member 8 in a plan view. As shown in FIGS. 1C and 1D, the second protruding member 62 is formed so that the position H2 of the upper end of the second protruding member 62 in the height direction is higher than the position H1 of the upper surface of the light emitting element 2 in the height direction and the position H2 is lower than the position H3 of the upper end of the first protruding member 61 in the height direction. Further, the upper end of the second protruding member 62 is covered by the cover member 8 and the second protruding member 62 is formed harder than the cover member 8. By using a resin material for the second protruding member 62 different from that for the cover member 8 or by increasing an amount of a filler contained in a resin, viscosity of the second protruding member 62 before curing is adjusted so as to be higher than that of the cover member 8 before curing. This allows the second protruding member 62 after curing to have higher hardness than that of the cover member 8 after curing. Still further, for the second protruding member 62, similarly to the first protruding member 61, the above-described transparent resin, white resin or black resin may be used.

In the method of manufacturing the light emitting device 100 to be described below, on the collective substrate, which is an aggregate of a plurality of mount substrates 1, the second protruding member 62 is arranged between light emitting elements 2 that are adjacent via boundaries, which are virtual lines demarcating the light emitting device 100, in a region defined by the first protruding member 61 formed as the frame body as described above.

With the second protruding member 62 arranged between the light emitting elements 2 that are adjacent via the boundaries of a plurality of light emitting devices 100, a level of an uncured liquid resin material is prevented from being lowered at the time of forming the cover member 8, as compared with the case where the second protruding member 62 is not arranged. Further, with the arrangement of the second protruding member 62, a position of the upper surface of the cover member 8 can be higher, so that generation of a recess (so-called, "sink mark") caused by hardening shrinkage of a resin material can be prevented. Still further, a portion of the cover member 8 to be cut in a thickness direction can be replaced by the second protruding member 62, which is harder than the cover member 8. Accordingly, when the light emitting devices 100 are singulated, the cover member 8 can be cut into a more stable shape.

The hardness of the cover member 8 and that of the second protruding member 62 can be compared, for example, in the case where the cover member 8 and the second protruding member 62 are made of resin, by using a value of a Shore A hardness measured by a durometer type A and a value of a Shore D hardness measured by a durometer type D on the condition. For example, the Shore A hardness of the cover member 8 after curing is in a range of A50 to A65, and Shore A hardness of the second protruding member 62 after curing is in a range of A70 to A85. In this case, the second protruding member 62 is harder than the cover member 8.

Underfill

An underfill 7 is filled in a space between the upper surface of the mount substrate 1 and a lower surface of the light emitting element 2, and is arranged to extend to a level that allows for covering a portion of each of the lateral surfaces of the light emitting element 2. The underfill 7 is preferably made of a white resin in which particles of a light reflecting, substance is contained in a resin material having a good light transmissive property such as a silicon resin or an epoxy resin to impart light reflectance. For a light reflecting substance, for example, titanium oxide, aluminum oxide, zinc oxide, carbonate barium, barium sulfate, boron nitride, aluminum nitride, or a glass filler may be suitably used.

Cover Member

The cover member 8 is arranged in a region surrounded by the first protruding member 61, and covers the lateral surfaces of the light emitting element 2 and the light transmissive member 3. The cover member 8 is arranged to seal and protect the light emitting element 2 from external force, dust, gas or the like, and to improve heat resistance, weather resistance, light resistance of the light emitting element 2 and the like.

Further, the cover member 8 preferably has a light shielding property. In the case where the cover member 8 has light reflectance as the light shielding property, the cover member 8 can reflect light emitted from the lateral surfaces of the light emitting element 2 and the light transmissive member 3 and allows light to be emitted from the upper surfaces of the light transmissive member 3, which serves as a light emitting surface of the light emitting device. Therefore, light extraction efficiency of the light emitting device 100 can be improved. In the case where the cover member 8 has a light absorbing property as the light shielding property, the cover member 8 can absorb the light emitted from the side surfaces of the light emitting elements 2 and allows for reducing light extraction from a surface other than the light emitting surfaces. Therefore, the light emitting device 100 can have clear brightness difference between a light emitting portion (i.e., light emitting surface of the light emitting device) and a non-light emitting portion (i.e., upper surface of the cover member 8) and smaller unevenness in color of emitted light.

If difference between the thermal expansion coefficient of the cover member 8 and that of the light transmissive member 3 is great, a stress may be applied and a crack may easily be generated in the cover member 8 at a portion near the light transmissive member 3 made of YAG glass or the like. Therefore, for the cover member 8, a soft resin having relatively low elasticity and good shape conformability is preferably used.

As a material for the cover member 8, a resin material having good light-transmittance and an insulating property, for example, a thermosetting resin such as an epoxy resin and a silicon resin may be suitably used. Further, particles of the light reflecting substance same as that used in the underfill 7 described above is dispersed in a resin material to be a base material to form a white resin, so that light reflectivity can be imparted to the cover member 8. Still further, particles of a light absorbing substance such as carbon black and graphite is dispersed in a resin material to be a base body to form a black resin, so that a light absorbing property can be imparted to the cover member 8. Still further, for the cover member 8, the same kind of resin as used for the first protruding member 61, the second protruding member 62, and the underfill 7 is preferably used. Using the same kind of resin as used for these members allows for improving adhesion between these members.

Method of Manufacturing Light Emitting Device

Figure 2:
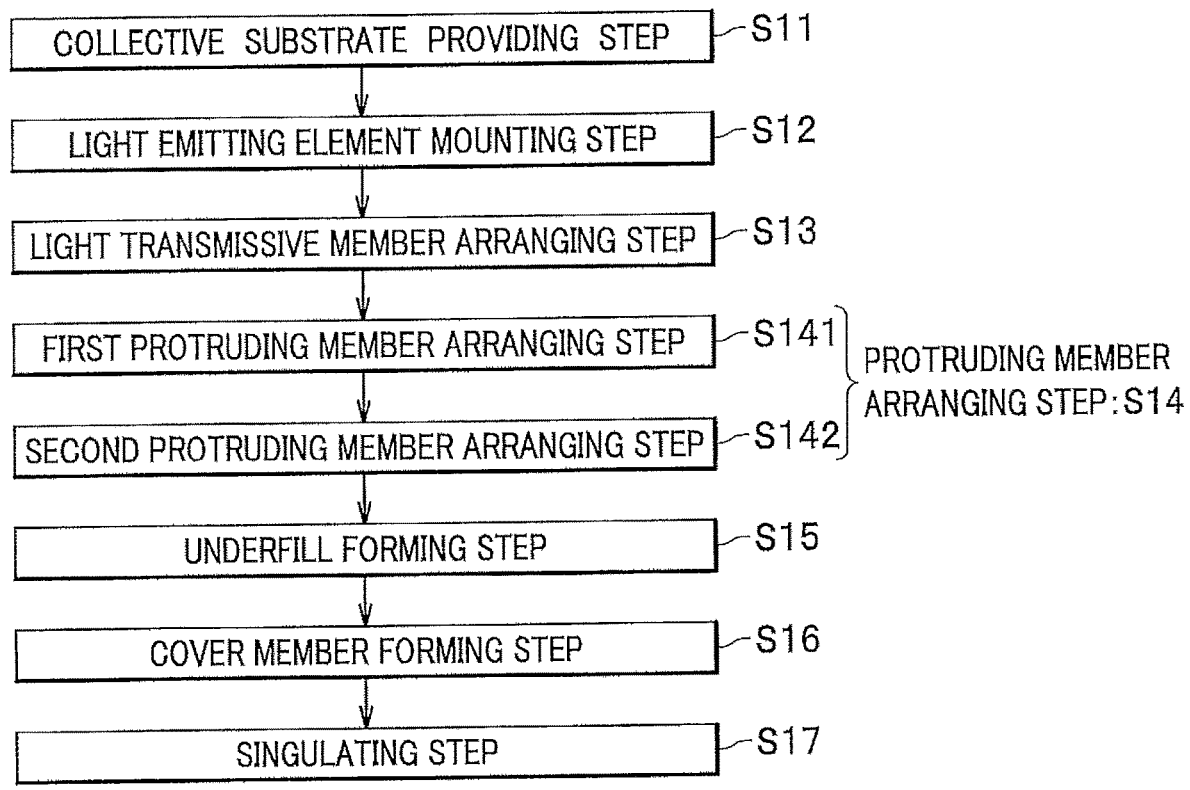
FIG. 2 is a flowchart illustrating steps of a method of manufacturing a light emitting device according to the first embodiment.
Figure 3A:
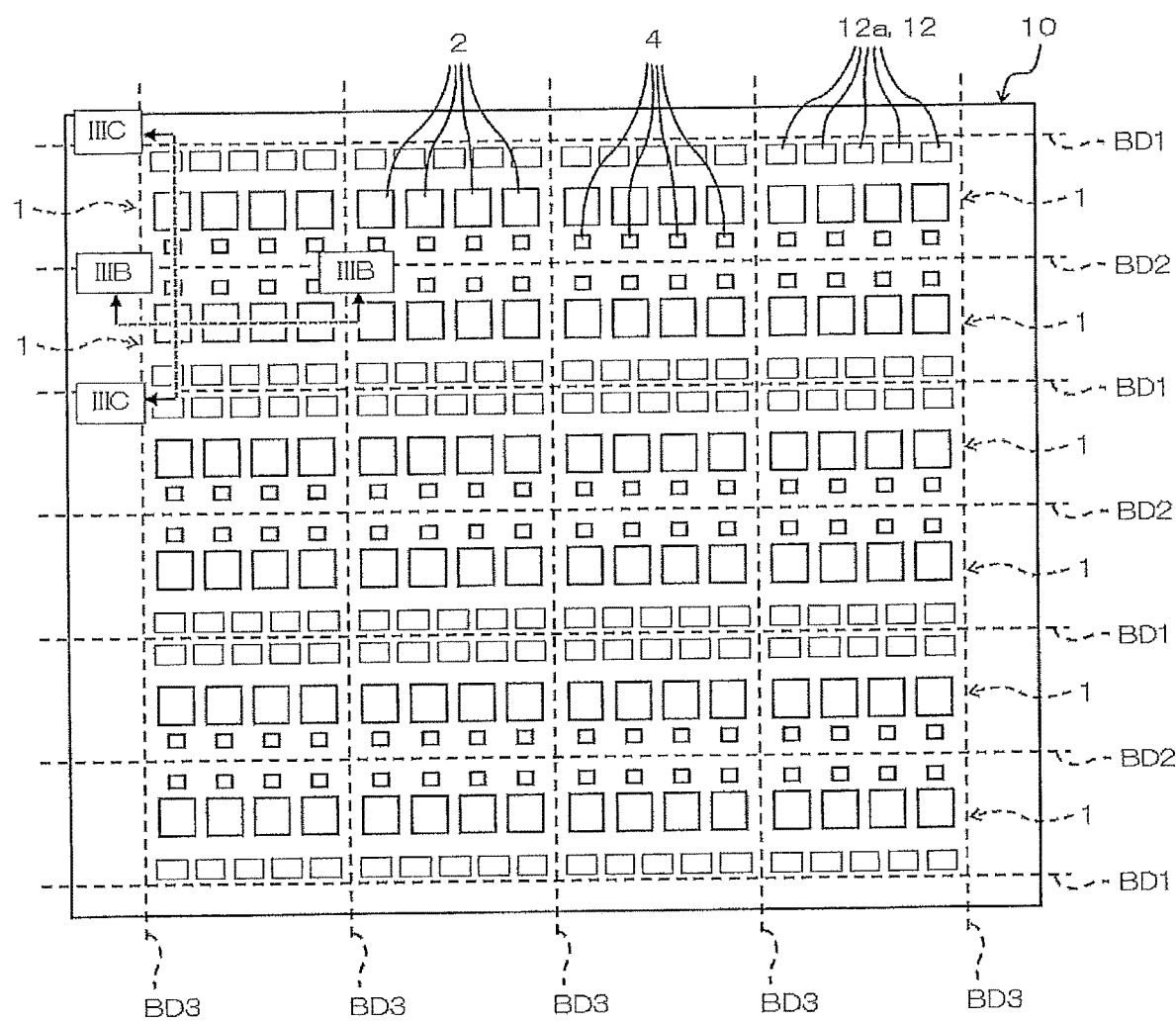
FIG. 3A is a schematic plan view illustrating a semiconductor element mounting step of the method of manufacturing a light emitting device according to the first embodiment.
Figure 3B:
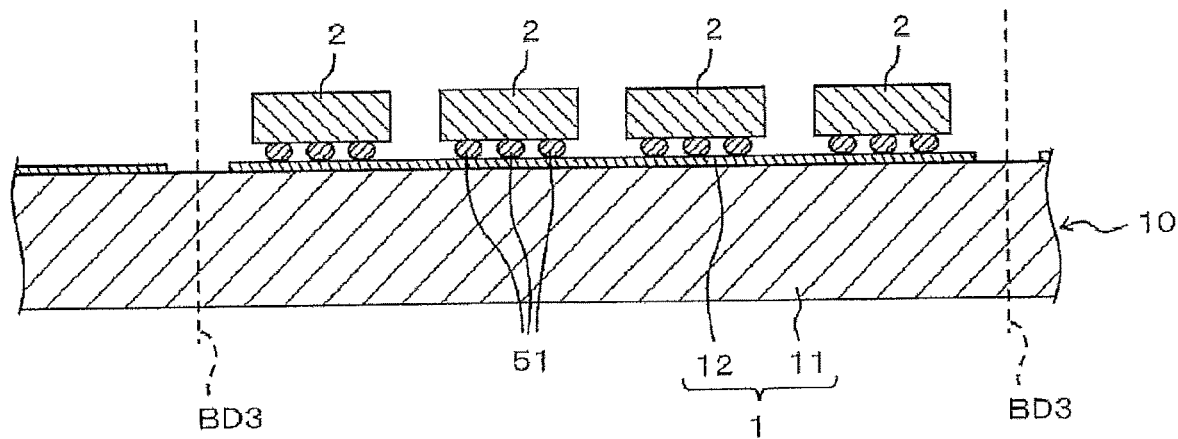
FIG. 3B is a schematic cross-sectional view taken along line IIIB-IIIB in FIG. 3A illustrating the semiconductor element mounting step of the method of manufacturing a light emitting device according to the first embodiment.
Figure 3C:
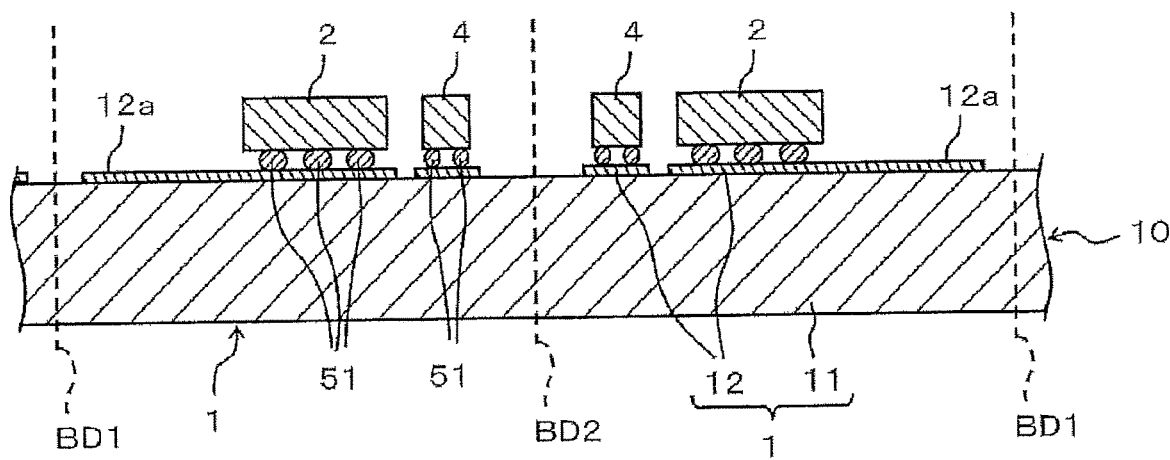
FIG. 3C is a schematic cross-sectional view taken along line IIIC-IIIC in FIG. 3A illustrating the semiconductor element mounting step of the method of manufacturing a light emitting device according to the first embodiment.
Figure 4A:
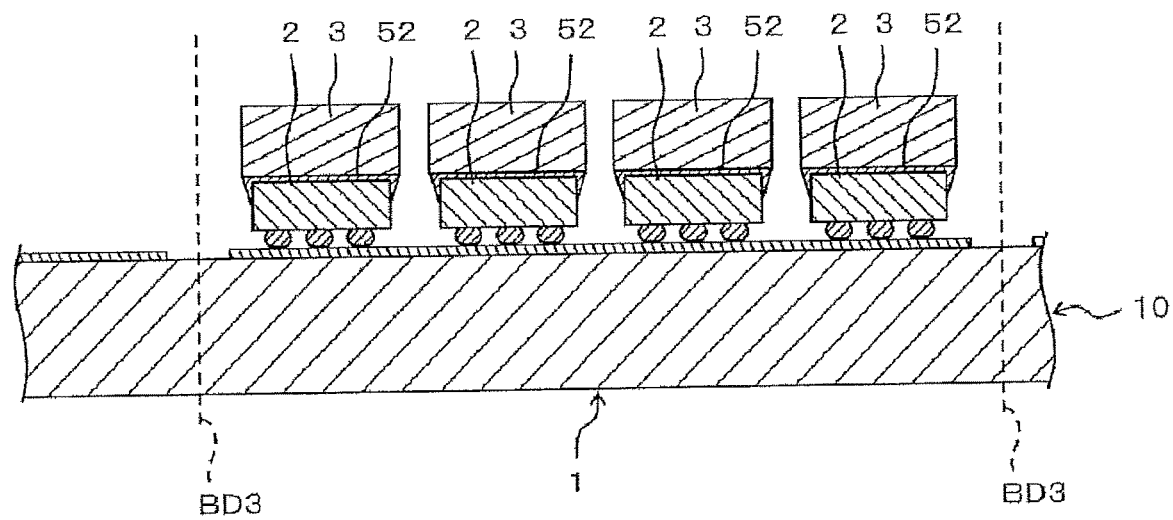
FIG. 4A is a schematic cross-sectional view illustrating a light transmissive member arranging step of the method of manufacturing a light emitting device according to the first embodiment taken along line IIIB-IIIB in FIG. 3A at a portion corresponding to line IIIB-IIIB.
Figure 4B:
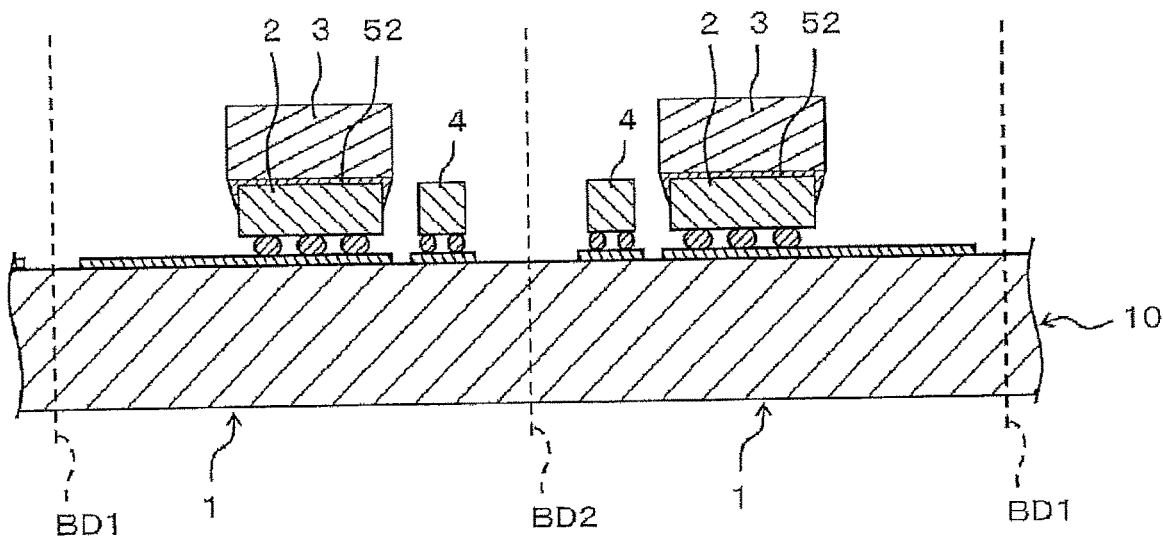
FIG. 4B is a schematic cross-sectional view illustrating the light transmissive member arranging step of the method of manufacturing a light emitting device according to the first embodiment taken along IIIC-IIIC at a portion corresponding to line IIIC-IIIC line in FIG. 3A at a portion corresponding to line IIIB-IIIB.
Figure 5A:
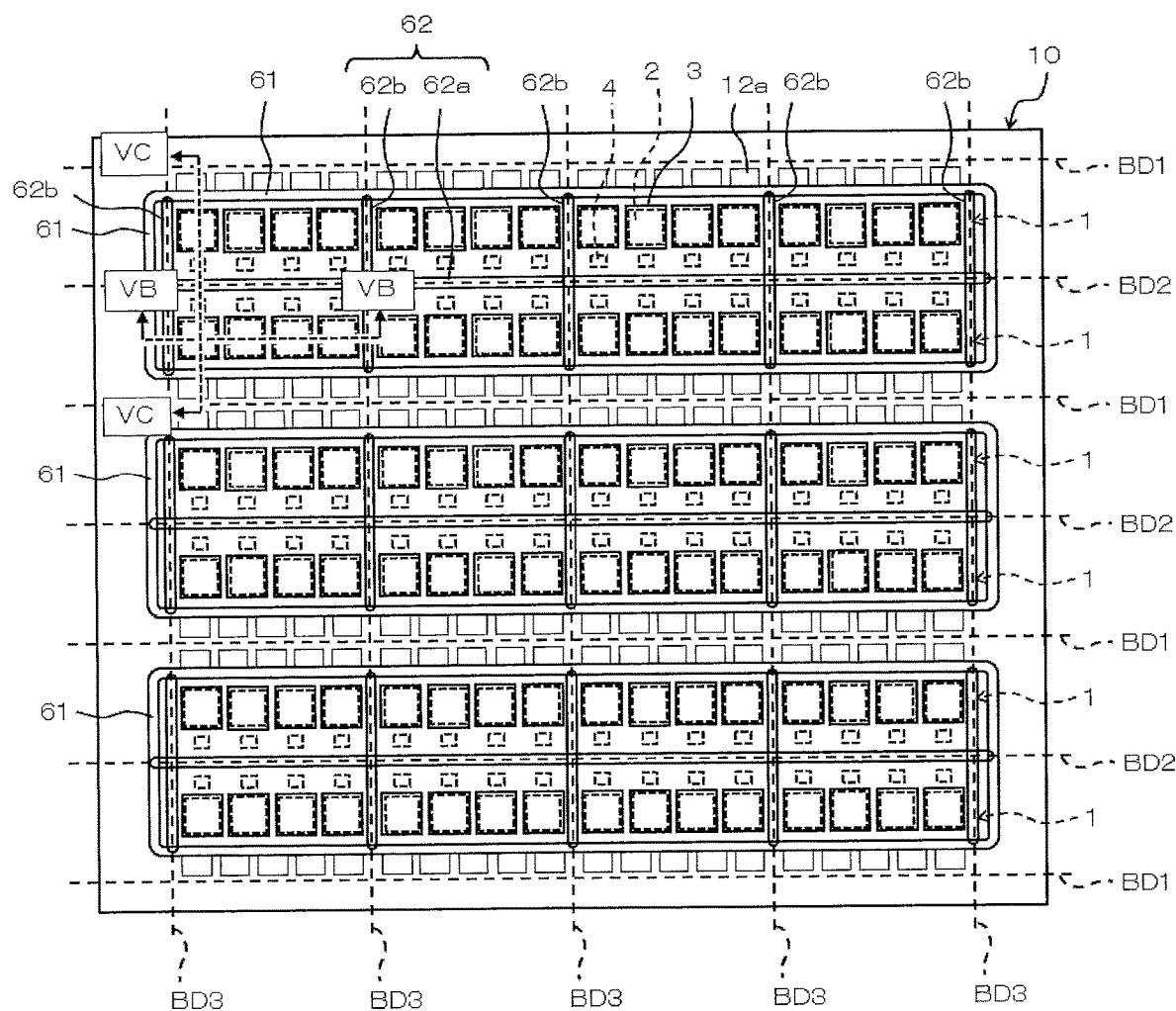
FIG. 5A is a schematic plan view illustrating a protruding member arranging step of the method of manufacturing a light emitting device according to the first embodiment.
Figure 5B:
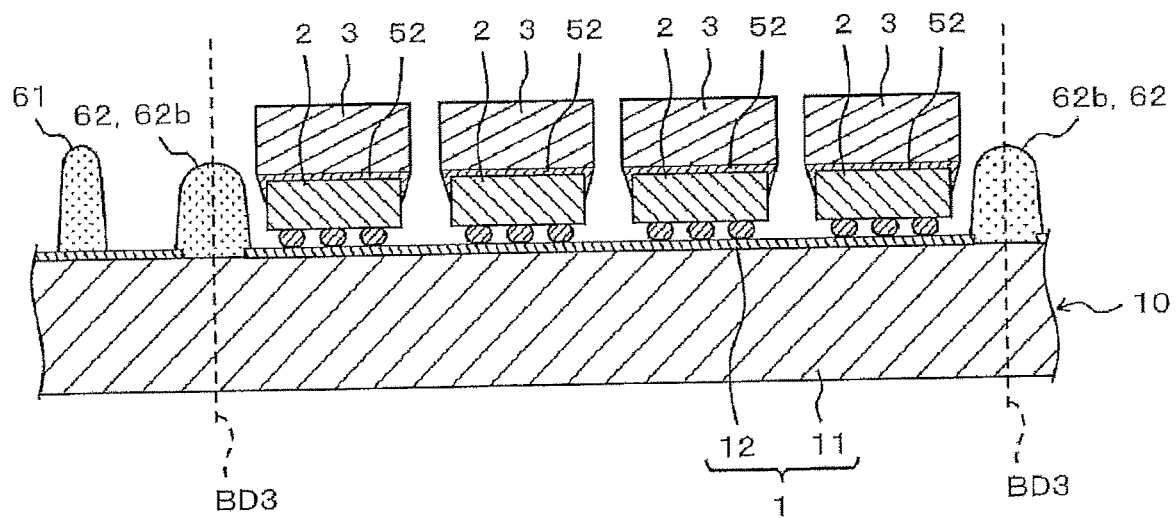
FIG. 5B is a schematic cross-sectional view illustrating arranging step of the method of manufacturing a light emitting device according to the first embodiment taken along line VB-VB in FIG. 5A at a portion corresponding to line VB-VB in the protruding member.
Figure 5C:
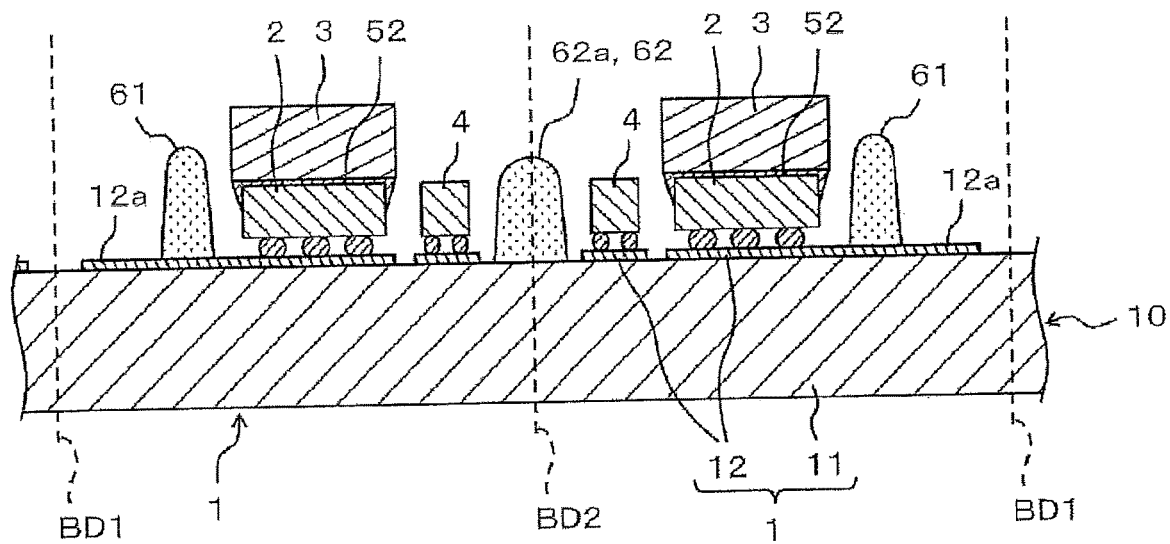
FIG. 5C is a schematic cross-sectional view illustrating the protruding member arranging step of the method of manufacturing a light emitting device according to the first embodiment taken along line VC-VC in FIG. 5A of the light emitting device at a portion corresponding to line VC-VC.
Figure 6:
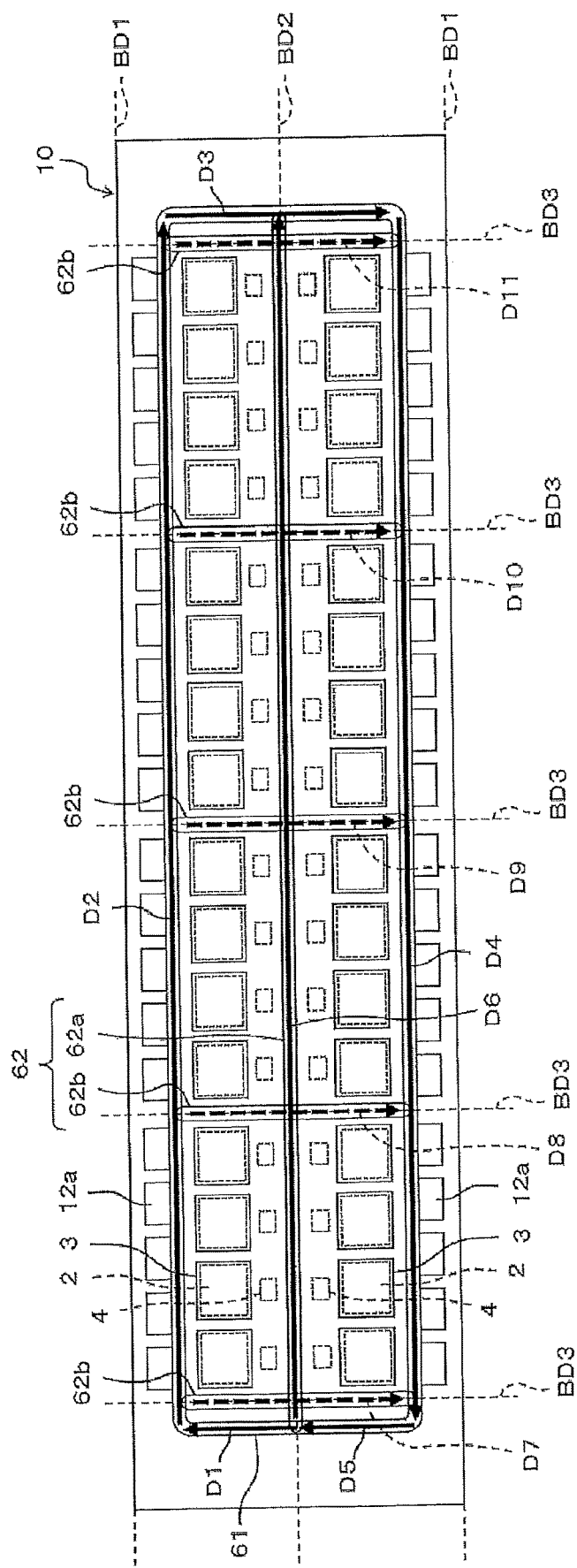
FIG. 6 is a schematic plan view illustrating an example of supplying uncured resin material to be a first protruding member and a second protruding member in the protruding member arranging step of the method of manufacturing a light emitting device according to the first embodiment.
Figure 7A:
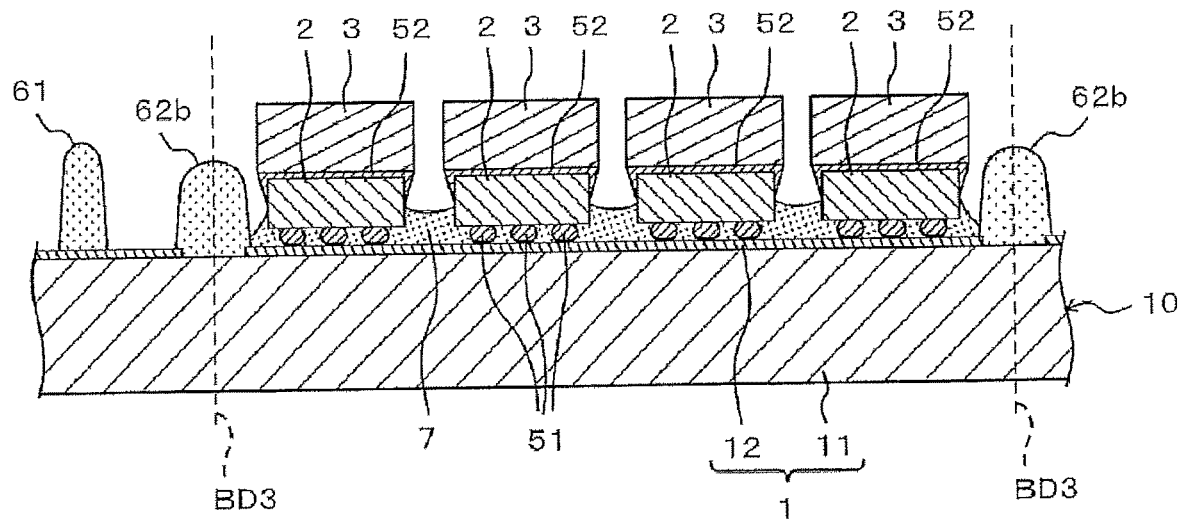
FIG. 7A is a schematic cross-sectional view illustrating an underfill forming step of the method of manufacturing a light emitting device according to the first embodiment taken along line IIIB-IIIB in FIG. 3A of the light emitting device at a portion corresponding to line IIIB-IIIB.
Figure 7B:
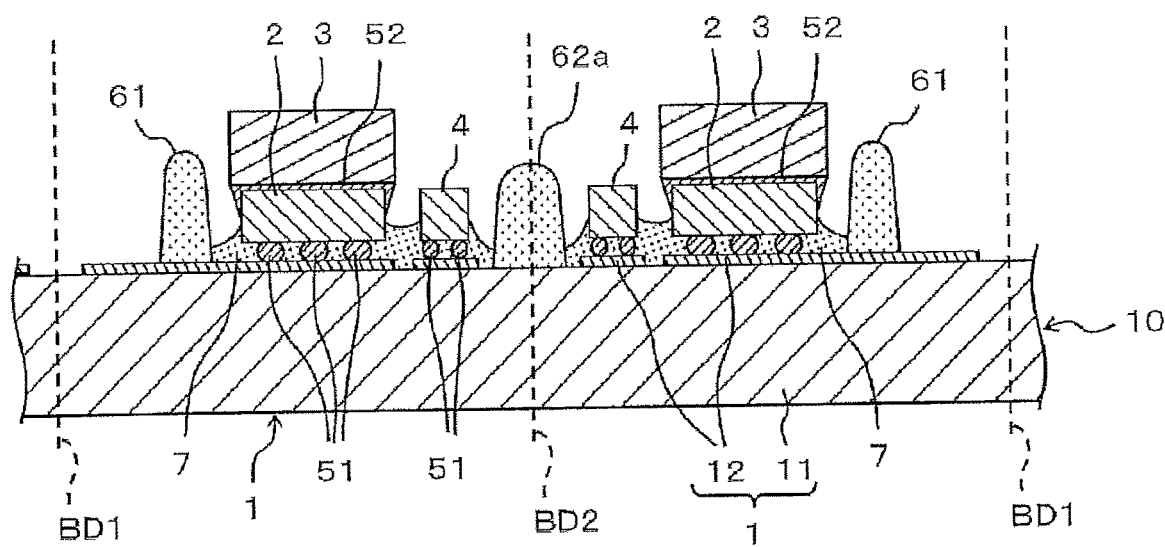
FIG. 7B is a schematic cross-sectional view illustrating the underfill forming step of the method of manufacturing a light emitting device according to the first embodiment taken along line IIIC-IIIC in FIG. 3A of the light emitting device at a portion corresponding to line IIIC-IIIC.
Figure 8A:
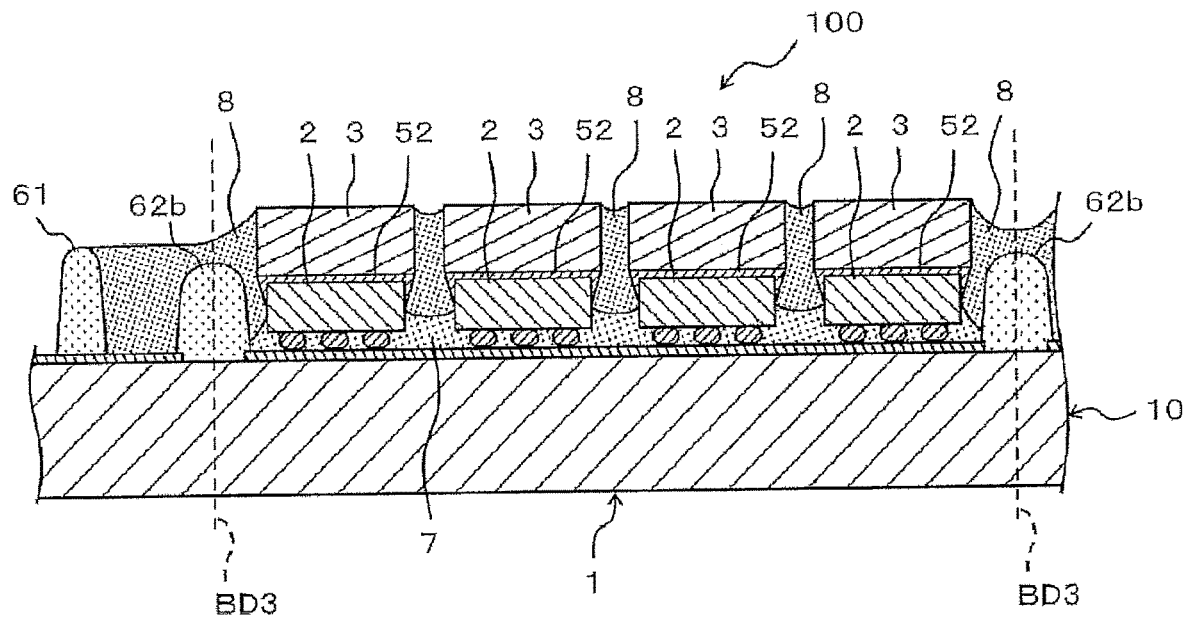
FIG. 8A is a schematic cross-sectional view illustrating a cover member forming step of the method of manufacturing a light emitting device according to the first embodiment taken along line IIIB-IIIB in FIG. 3A of the light emitting device at a portion corresponding to line IIIB-IIIB.
Figure 8B:
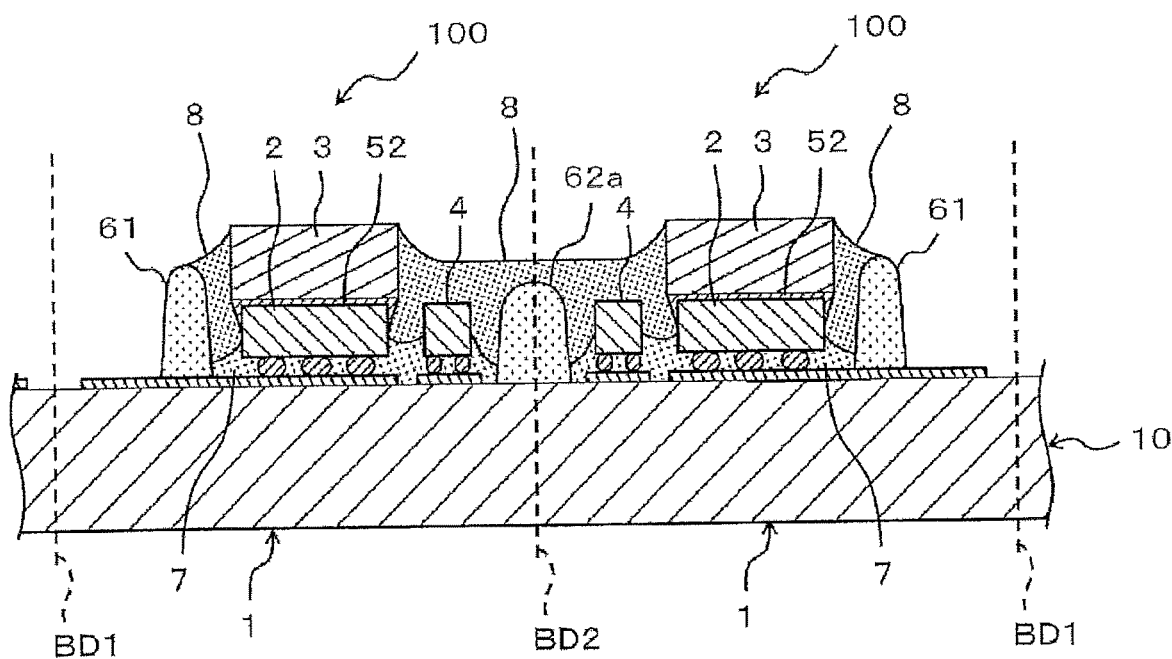
FIG. 8B is a schematic cross-sectional view illustrating the cover member forming step of the method of manufacturing a light emitting device according to the first embodiment taken along line IIIC-IIIC in FIG. 3A of the light emitting device at a portion corresponding to line IIIC-IIIC.
Figure 9:
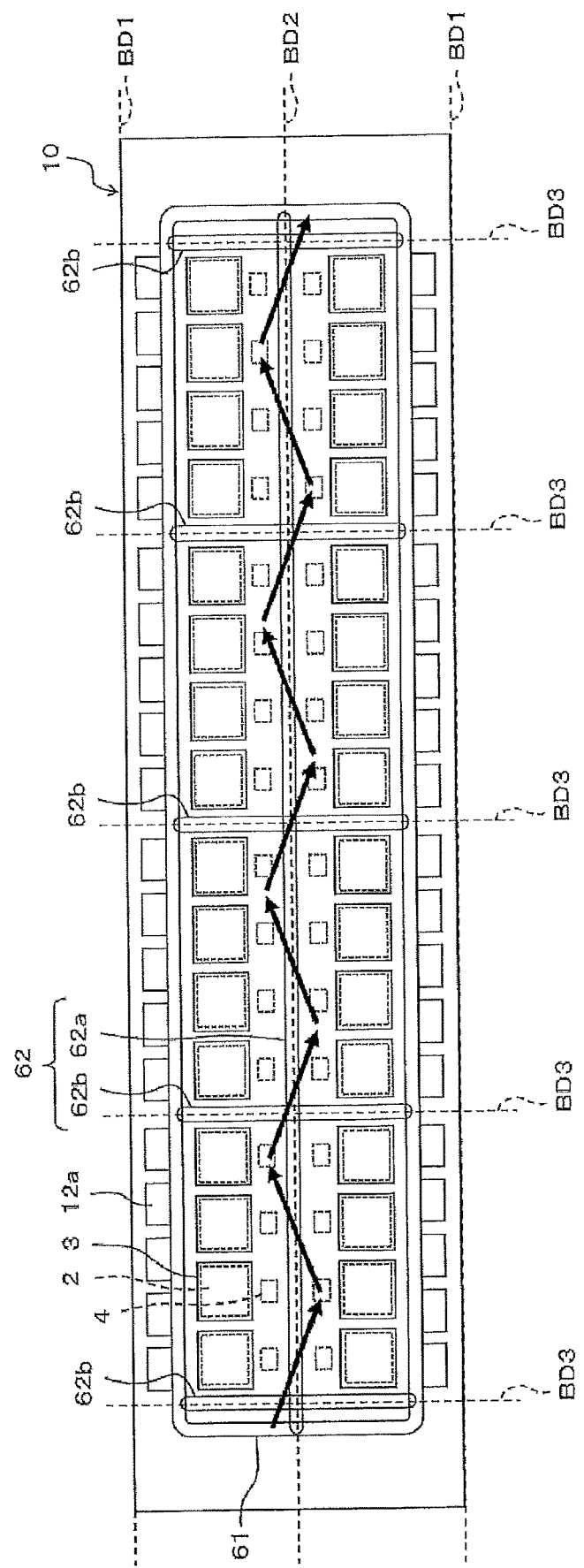
FIG. 9 is a schematic plan view illustrating an example of supplying uncured resin material to be a cover member in the cover member forming step of the method of manufacturing a light emitting device according to the first embodiment.
Figure 10A:
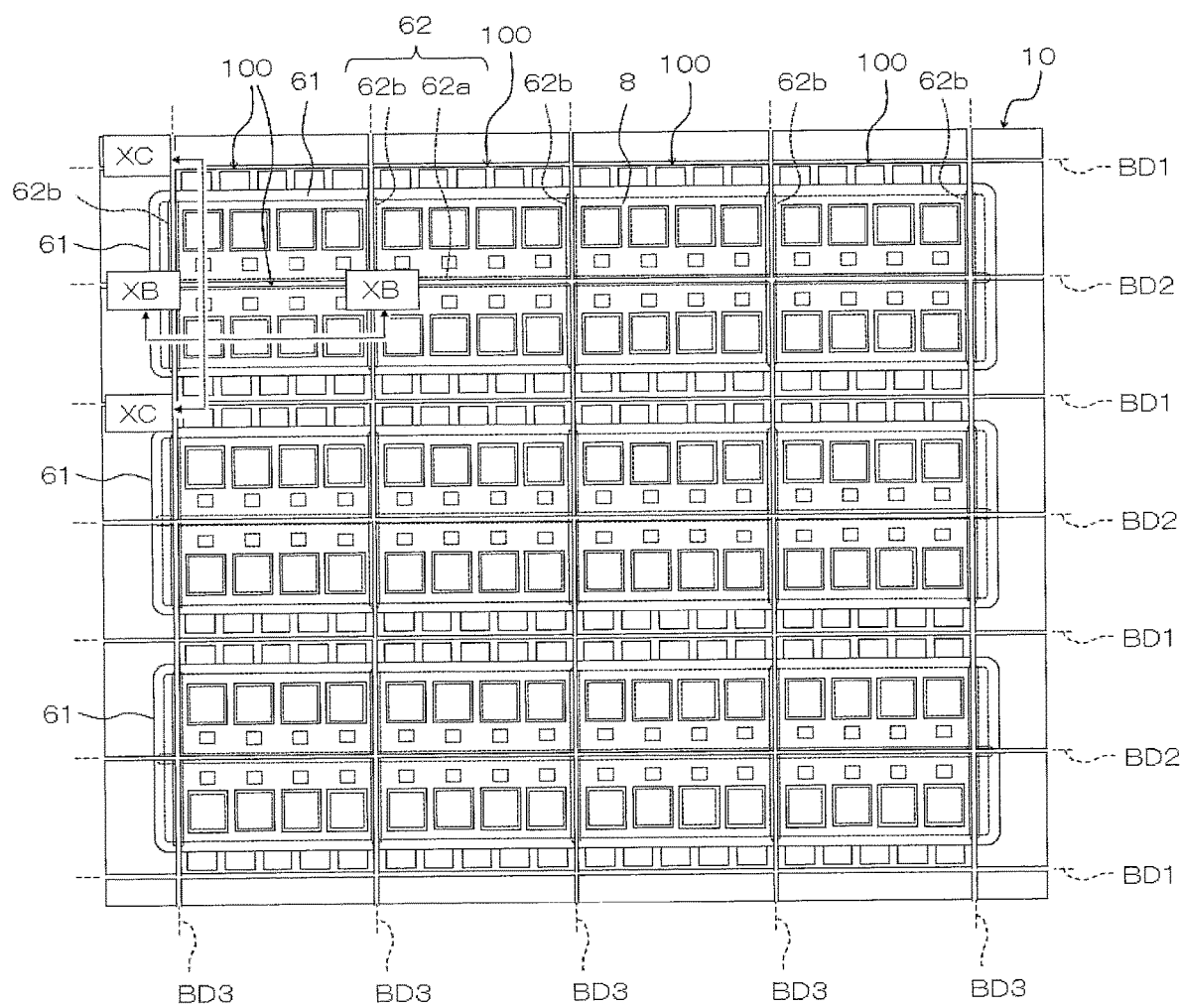
FIG. 10A is a schematic plan view illustrating a singulating step of the method of manufacturing a light emitting device according to the first embodiment.
Figure 10B:
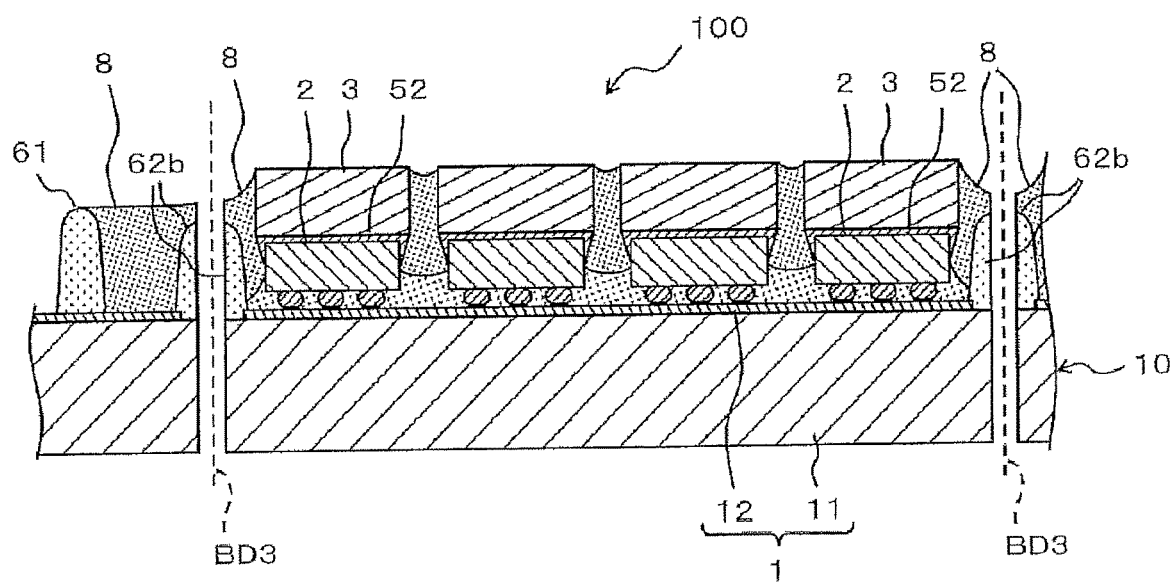
FIG. 10B is a schematic cross-sectional view taken along a line XB-XB in FIG. 10A of the light emitting device illustrating the singulating step in the method of manufacturing a light emitting device according to the first embodiment.
Figure 10C:
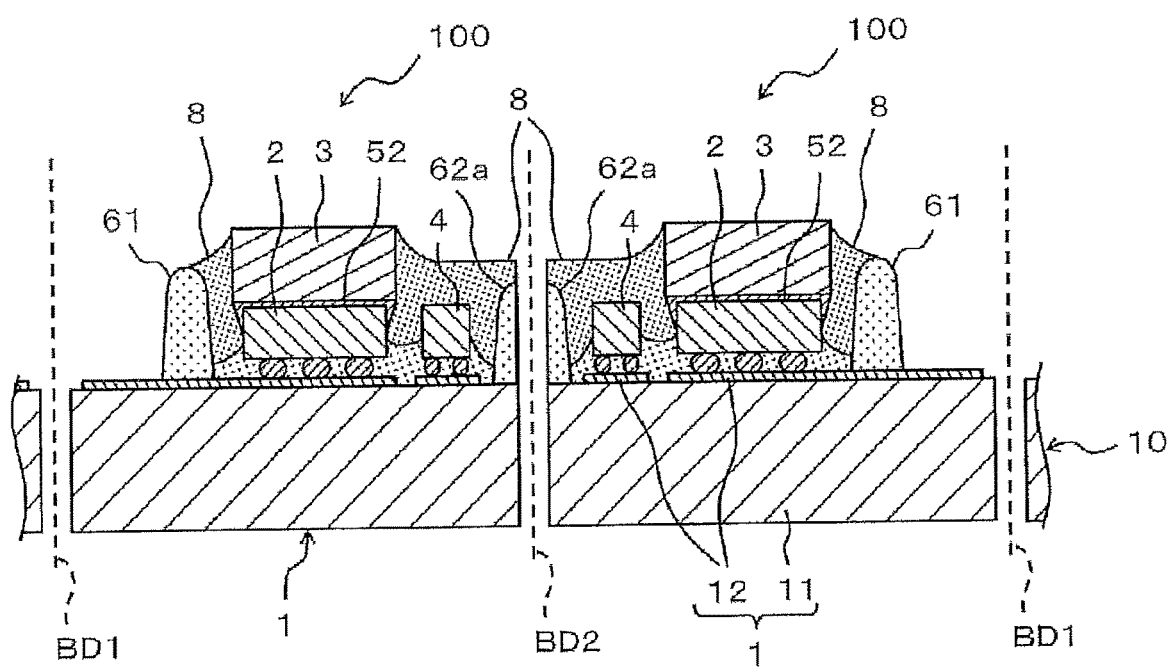
FIG. 10C is a schematic cross-sectional view taken along a line XC-XC in FIG. 10A of the light emitting device illustrating the singulating step of the method of manufacturing a light emitting device according to the first embodiment.

Next, a method of manufacturing a light emitting device according to the first embodiment is described below with reference to FIGS. 2 to 10C. In FIG. 3A, only the external connection portions 12a of the wiring 12 are shown and illustrations of wiring patterns arranged to extend on the support member 11 from the external connection portions 12 are omitted. In FIGS. 3A to 10C, boundaries BD1, BD2, BD3 are shown by broken lines, which are virtual lines demarcating regions in each of which a plurality of light emitting devices 100 are to be formed. FIGS. 6 and 9 each show a region on the collective substrate 10.

The method of manufacturing a light emitting device according to the present embodiment includes: a collective substrate providing step S11; a light emitting element mounting step S12; a light transmissive member arranging step S13; a protruding member arranging step S14; an underfill forming step S15; a cover member forming step S16 and a singulating step S17. Further, the protruding member arranging step S14 includes a first protruding member arranging step S141 and a second protruding member arranging step S142.

In the collective substrate providing step S11, the collective substrate 10 in which a plurality of mount substrates 1 are continuously formed is provided. The collective substrate 10 may be manufactured by forming the wiring 12 having predetermined patterns on the support member 11 with a flat-plate shape having the area for a plurality of light emitting devices. The wiring 12 may be formed by applying a metal foil made of such as Cu and Al, applying a metal powder paste made of such as Cu and Ag, or by plating a metal such as Cu. Further, the wiring 12 may be patterned by an etching method or a printing method.

Note that the collective substrate providing step S11 is not limited to manufacturing the collective substrate 10 in the manner as described above, and may include obtaining the collective substrate 10 by purchasing.

In the light emitting element mounting step S12, a plurality of light emitting elements 2 is mounted on the collective substrate 10. Metal bumps serving as the bonding member 51 are arranged on the electrodes of the light emitting elements 2 according to the present embodiment, and the light emitting elements 2 are flip-chip mounted on predetermined portions of the wiring 12 using an ultrasonic bonding method. Further, in this step, the protective elements 4 are also mounted on the collective substrate 10. Any method may be used for the mounting method, and, for example, a solder paste may be used for the bonding member 51, and the light emitting elements 2 is mounted by using a reflow method.

In the present embodiment, four light emitting elements 2 and four protective elements 4 are mounted in each region to be one light emitting device, which is demarcated by the boundaries BD 1, BD2, and BD3. The boundaries BD 1, BD 2 are virtual lines that longitudinally demarcate regions each for forming the light emitting device, and the boundary BD3 is a virtual line that transversely demarcate the regions each for forming the light emitting device. As shown by arranged positions of the external connection portions 12a of the wiring 12, the regions each for forming the light emitting devices are arranged in the transverse direction (vertical direction in FIG. 3A) so as to face in different orientation in the vertical direction every other line. That is, in the present embodiment, the regions each for forming the light emitting device are arranged to be substantially axisymmetrical with respect to the boundary BD2 in a plan view. Accordingly, the light emitting elements 2 are arranged on the collective substrate 10 so as to be substantially axisymmetrical with respect to the boundary BD2.

In each region for forming the light emitting devices, the four light emitting elements 2 each having a substantially square shape in a plan view are arranged in a line in the longitudinal direction approximately in the center in the transverse direction. Further, the four protective elements 4 are each arranged at a position corresponding to approximately in the middle of each of the light emitting elements 2 in the longitudinal direction (i.e., lateral direction in FIG. 3A) on an opposite side to a side where the external connection portions 12a are arranged for each of the light emitting elements 2 in the transverse direction (vertical direction in FIG. 3A).

In the light transmissive member arranging step S13, at least one light transmissive member 3 for each light emitting device is arranged on the upper surfaces of a plurality of light emitting elements 2. The light transmissive members 3 are bonded with the light emitting elements 2 by the bonding member 52 such as a resin having light transmissiveness. In the case where one light transmissive member 3 is bonded with each of the light emitting elements 2, the light emitting element mounting step S12 and the light transmissive member arranging step S13 may be repeated alternately until a predetermined number of each of light emitting elements 2 and light transmissive members 3 are mounted. That is, every after mounting one light emitting element 2, each of the light transmissive members 3 may be bonded to the upper surface of the light emitting element 2. With such bonding, time from the mounting of the light emitting element 2 to the bonding of the light transmissive member 3 can be shortened, so that attachment of impurities such as dust on the upper surface of the light emitting element 2 can be reduced.

In the protruding member arranging step S14, the first protruding member 61 and the second protruding member 62 are arranged in predetermined regions on the collective substrate 10. Step S14 includes the first protruding member arranging step S141 and the second protruding member arranging step S142. In the case where a plurality of first protruding members 61 are arranged on one collective substrate 10, the first protruding member arranging step S141 and the second protruding member arranging step S142 may be performed alternately.

In the first protruding member arranging step S141, on the upper surface of the collective substrate 10, the first protruding member 61 are arranged so as to surround a plurality of light emitting elements 2 on the collective substrate 10. The first protruding member 61 is arranged on the upper surface of the collective substrate 10 so as to surround an outer edge of a region in which the light emitting elements 2 are arranged.

The first protruding member 61 serves as an outer frame for preventing a resin material from spreading on the upper surface of the collective substrate 10 at the time of supplying the uncured resin material for forming the cover member 8 in the cover member forming step S16.

With respect to the upper surface of the mount substrate 1, the upper end of the first protruding member 61 is located higher than the upper surface of the light emitting element 2 and higher than the upper end of the second concave member 62. With this arrangement, at the time of supplying the uncured resin material for forming the cover member 8 into the region surrounded by the first protruding member 61, the resin material can be filled so that a level thereof is located higher than the upper surface of the light emitting element 2.

Further, with respect to the upper surface of the mount substrate 1, the upper end of the first protruding member 61 is preferably located lower than the upper surface of the light transmissive member 3. With this arrangement, at the time of supplying the uncured resin material for forming the cover member 8, the resin material can be prevented from extending to the upper surface of the light transmissive member 3 and blocking light emission. Still further, with the first protruding member 61 having a height lower than the upper surface of the light transmissive member 3, unevenness of brightness due to reflection of light emitted from the upper surface of the light transmissive member 3 at the upper surface of the cover member 8 can be reduced.

The first protruding member 61 is arranged along the outer edge of a region for forming the cover member 8 in every region for forming predetermined number of the light emitting devices 100. As shown in FIG. 5A, in the present embodiment, the first protruding member 61 is arranged in every region for forming a total of eight light emitting devices 100, four in the lateral direction and two in the vertical direction so as to surround thirty-two light emitting elements 2 to be mounted in the region for forming the eight light emitting devices 100. Further, in the present embodiment, three first protruding members 61 are arranged on the upper surface of one collective substrate 10.

The first protruding member 61 may be preferably made of a thermosetting resin. In this case, first, using a dispenser or the like, a resin material is arranged so as to draw a line on the upper surface of the collective substrate 10, along the outer edge of a region composed of the predetermined number of regions each for forming the cover member 8. The uncured resin material used in this case is adjusted to have appropriate viscosity so that the upper end of the resin material after arrangement is located higher than the upper surface of the light emitting element 2, in accordance with the width and the height thereof. Then, heat treatment is performed to cure the resin material, so that the first protruding member 61 can be formed.

The viscosity of the uncured resin material may be adjusted by an amount of a solvent used for the resin material or an additive amount of a proper filler.

Further, in this step, the expression "arranging the first protruding member 61" includes arranging an uncured resin material, or preferably, a resin material in a semi-cured state, and is not limited to arranging the resin material that is completely cured.

In the second protruding member arranging step S142, the second protruding member 62 are arranged between a plurality of light emitting elements 2 on the upper surface of the collective substrate 10. In a region where the first protruding member 61 is arranged on the upper surface of the collective substrate 10, the second protruding member 62 is arranged between the adjacent light emitting elements 2 via boundaries BD2, BD3, which demarcate the regions each for forming the light emitting device 100. The second protruding member 62 is arranged to prevent lowering of the level of the resin material to be the cover member 8 arranged around the light emitting elements 2 and the light transmissive members 3, at the time of supplying the uncured resin material to be the cover member 8 in the cover member forming step S16. Accordingly, the upper end of the second protruding member 62 is located higher than the upper surface of the light emitting element 2 and lower than the upper end of the first protruding member 61.

Further, as described above, the cover member 8 is formed of soft resin in order to prevent generation of cracks. However, a soft resin is soft and is easily stretched, which may lead to an unstable shape of a cut surface at the time of cutting the cover member 8 in the singulating step S17.

For this reason, at the position of the cover member 8 to be cut in the singulating step S17, the second protruding member 62 harder than the cover member 8 is arranged in a portion in a thickness direction of the cover member 8. This allows the shape of the cut surface to be stable.

Also, the second protruding member 62 is formed to have a height smaller than the first protruding member 61, which is an outer frame, so that filling of the resin material to be the cover member 8 in each region for forming the light emitting device 100 can be facilitated. In other words, the cover member 8 can be supplied continuously to a plurality of light emitting devices 100 each including a plurality of light emitting elements surrounded by the first protruding member 61. With this, the manufacturing process can be simplified.

Specific examples of the height of each member is described below.

With respect to the upper surface of the collective substrate 10, the height of the upper surface of the light emitting element 2 is 170 μm, and the height of the upper surface of the light transmissive member 3 is 350 μm. In this case, the height of the upper end of the first protruding member 61 is preferably smaller than the height of the upper surface of the light transmissive member 3 by 10 to 100 μm. Further, the height of the upper end of the second protruding member 62 is preferably greater than the height of the upper surface of the light emitting element 2 by 30 to 80 μm. With such heights, a level of the uncured resin material for forming the cover member 8 can be prevented from being lowered.

The second protruding member 62 in the manner and procedure that are similar to the first protruding member 61, preferably using a thermosetting resin.

Since the second protruding member 62 is to be cut by a dicing blade or the like in the singulating step S17, the second protruding member 62 is formed to have an appropriate width. Accordingly, the resin material is adjusted to have appropriate viscosity in accordance with the width and the height thereof. Further, selecting a suitable resin for the second protruding member 62 or adjusting a resin material to contain an appropriate content of a filler allows the second protruding member 62 after curing to be harder than the cover member 8 after curing. The viscosity of the second protruding member 62 before curing may be, for example, in a range of 300 Pa·s to 500 Pa·s.

The first protruding member 61 and the second protruding member 62a may be made of the same resin and may be integrally formed. An example of such configuration is shown in FIG. 6.

At first, starting from a position (i.e., left end in FIG. 6) where the first protruding member 61 intersects the second protruding member 62a, a resin material is supplied while moving a nozzle of the dispenser round twice in the order of arrows D1 to D5, so that the first protruding member 61 is arranged. That is, the uncured resin material is supplied in two layers on the collective substrate 10, so that the first protruding member 61 is arranged.

Subsequently, the resin material is supplied while the nozzle of the dispenser is moved along an arrow D6 from the position at which supplying the resin material has started, so that the second protruding member 62a is arranged. That is, supplying the uncured resin material in one layer on the collective substrate 10 allows for arranging the second protruding member 62a having smaller height than the height of the first protruding member 61 having two layers of the resin material. With this arrangement, the first protruding member 61 can be integrally formed with the second protruding member 62a having different height in a manner of a single stroke in succession, which can improve efficiency of the process. Supplying the resin material for forming the second protruding member 62a may be performed between supplying the first layer (i.e., first round) and supplying the second layer (i.e., second round) of the first protruding member 61, or may be performed before supplying the first layer (i.e., first round) of the first protruding member 61. Also with these manners, the first protruding member 61 and the second protruding member 62a having different height can be arranged in succession in a manner of a single stroke. Then, the nozzle of the dispenser is moved and the resin material is supplied on a plurality of boundaries BD3, so that the second protruding members 62b is arranged.

In the present embodiment, the second protruding member 62a or the second protruding members 62b are arranged in regions to be the outer edges of the cover member 8 in each light emitting device 100 except for a portion of the outer peripheries of the cover member 8 where the first protruding member 61 is arranged, which may be partially omitted.

For example, with arrangement of the light transmissive members 3 to be near the outer edges of the light emitting devices 100, that is, with a narrow interval between the adjacent light transmissive members 3 via the boundary BD3, lowering of the level of the resin material between the light transmissive members 3 at the time of supplying the uncured resin material in the cover member forming step S16 is small. Accordingly, for the purpose of securing sufficient height of the cover member 8, the second protruding members 62b may be omitted.

Further, in the case where a thermosetting resin is used for the resin material of the first protruding member 61 and the second protruding member 62, the first protruding member 61 and the second protruding member 62 may be subjected to the heat treatment for complete curing after arranging all of the first protruding member 61 and the second protruding member 62 to be arranged on the collective substrate 10. Still further, in a case where a thermosetting resin is used for the resin material of the cover member 8 to be described later, the first protruding member 61, the second protruding member 62 and the cover member 8 may be collectively subjected to the heat treatment for complete curing after supplying the uncured resin material for forming the cover member 8 in a region where the first protruding member 61 has been arranged. Collectively performing the heat treatment for the complete curing is preferable because it allows the step to be performed more efficiently and allows for increasing adhesion between members to be completely cured.

In the underfill forming step S15, the underfill 7 is formed so as to fill the space between the lower surface of each of the light emitting elements 2 and the upper surface of the mount substrate 1. The underfill 7 is preferably arranged to a height that allows a portion of the lateral surfaces of each of the light emitting elements 2 to be covered, and is preferably arranged to cover up to a region near the light emitting element located outside of the light emitting element 2 in a plan view.

The underfill 7 may be formed by supplying a white resin, in which a light reflecting substance is preferably contained to impart light reflectivity, to a region around each of the light emitting elements 2 by a dispenser or the like.

While the underfill 7 may be omitted depending on a method for bonding the light emitting element 2 on the mount substrate 1, or the like, the underfill 7 is preferably arranged because it allows light leaked from the lower surface of the light emitting element 2 to be returned, which can increase light extraction efficiency.

Further, the underfill forming step S15 may be performed before the protruding member arranging step S14, but is preferably performed after the protruding member arranging step S14. By performing the protruding member arranging step S14 earlier, the first protruding member 61 and the second protruding member 62 may be closely contacted to the mount substrate 1 without the underfill 7.

In the cover member forming step S16, which is performed after the protruding member arranging step S14, the cover member 8 is formed in the region surrounded by the first protruding member 61. The cover member 8 is formed so as to cover the lateral surfaces of each of the light emitting elements 2 and the lateral surfaces of each of the light transmissive members 3. The cover member 8 in the present embodiment is made of a white resin in which particles of a light reflecting substance serving as a light shielding substance are contained in a light-transmissive resin. Meanwhile, in accordance with a purpose, a wavelength conversion substance or colored particles for adjusting color tone, a filler for adjusting viscosity, or other fillers may be contained in place of or in addition to the light reflecting substance. Further, a black resin containing particles of a light absorbing substance may be used. A thermosetting resin may be preferably used for the resin. In this case, an uncured resin material in which the above-described filler is contained in accordance with a purpose may be supplied in the region where the first protruding member 61 is arranged by a potting method using a suitable dispenser, and a heating treatment is performed to cure the thermosetting resin, so that the cover member 8 is formed.

Note that viscosity and supplying amount of the uncured resin material to be the cover member 8 is adjusted so that the resin material covers the lateral surfaces of the light transmissive member 3, preferably up to the upper end of the lateral surfaces of the light transmissive member 3, and covers the upper end of the second protruding member 62 without extending higher than the upper surface of the light transmissive member 3 and being overflown from the first protruding member 61 that serves as an outer frame for restricting the spread of the resin material. The viscosity of the cover member 8 before curing is, for example, in a range of 1 Pa·s to 20 Pa·s.

In the case where the distance between members for restricting the height of the level of the uncured resin material, such as a distance between the light transmissive member 3 arranged at an end in the longitudinal (lateral) direction and the first protruding member 61 serving as an outer frame (see FIG. 8A), or a distance between the adjacent light transmissive members 3 in the transverse (vertical) direction (see FIG. 8B), is ling, the second protruding member 62 (62a, 62b) is preferably arranged. With this arrangement, the level of the uncured resin material arranged between the light transmissive members 3 can be prevented from being located lowered than the upper end of the second protruding member 62.

Further, in the case where the light emitting device 100 includes a semiconductor element other than the light emitting element 2 having a certain amount of height, such as a protective element, the semiconductor element is preferably arranged near the light transmissive member 3. With this arrangement, the level of the resin material is prevented from being lowered near the lateral surfaces of the light transmissive member 3. Arrangement of the semiconductor element between the light transmissive members 3 with a large spacing distance therebetween and the arrangement of the second protruding member 62 allows the level of the uncured resin material to be further prevented from being lowered effectively.

Still further, in the present embodiment, the uncured resin material to be the cover member 8 is supplied from a region near the boundary BD2 that demarcates the regions for forming the light emitting device in FIG so as to be adjacent in the up/down direction. In this manner, the uncured resin material is preferably supplied from a position apart from any of the light transmissive members 3 in the region where the first protruding member 61 is arranged. Accordingly, the resin material can be prevented from being attached to the upper surface of the light transmissive member 3 at the time of supplying the uncured resin material.

Further, as indicated by arrows in FIG. 9, the uncured resin material is preferably supplied from above while moving the nozzle of the dispenser to meander in the regions each forming the light emitting devices on both sides across the region over the second protruding member 62a arranged along the boundary BD 2. In this manner, movement of the nozzle to meander across the boundary BD2 while supplying the resin material allows for supplying the resin material continuously in, a plurality of regions having the boundary BD2 therebetween. The position of the upper end of the second protruding member 62a on the boundary BD2 is lower than the position of the upper end of the first protruding member 61, so that the uncured resin material to be the cover member 8 buries the second protruding member 62, and is evenly arranged in the region surrounded by the first protruding member 61. In this manner, the resin material can be evenly supplied in each region for forming the light emitting device surrounded by the first protruding member 61. Further, supplying the uncured resin material along the direction in which more regions for forming the light emitting devices are demarcated (i.e., extending direction of the boundary line BD 2) allows movement of the nozzle of the dispenser to be reduced, so that the time for this step can be shortened.

In the singulating step S17, the cover member 8, the second protruding member 62, and the collective substrate 10 are divided at a position including the second protruding member 62. The light emitting devices 100 may be singulated by cutting with, preferably, a dicing blade. In the portion to be cut, the second protruding member 62 (62a, 62b) harder than the cover member 8 is arranged at a lower portion of the cover member 8, so that dividing can be performed to obtain a stable cutting shape compared with the case where the portion to be cut is constituted only by the cover member 8.

In the case where a material having characteristics different from that of resin such as ceramics is used for the support member 11 of the mount substrate 1, cutting of a resin layer including the cover member 8 and the second protruding member 62 and cutting of the collective substrate 10 may be may be performed in separate steps, in each of which dicing may be performed using a dicing blade suitable for each cutting. Further, the end portions of the collective substrate 10 may not be cut. With this cutting, the light emitting devices 100 are connected to each other until both the boundaries BD1, BD2 extending in the lateral direction and the boundary BD3 extending in the vertical direction are cut, so that the collective substrate 10 can be handled easily. Still further, while any of the boundaries BD1, BD2, BD3 can be cut at first in the present embodiment, a boundary to be difficult to cut may preferably be diced first, such as a portion made of a relatively soft material or a portion asymmetrical with respect to a boundary due to, for example, difference in materials or shapes. With this cutting, the light emitting devices 100 can be divided more precisely. With the steps above, the light emitting devices 100 can be manufactured.

Variant Examples

Figure 11A:
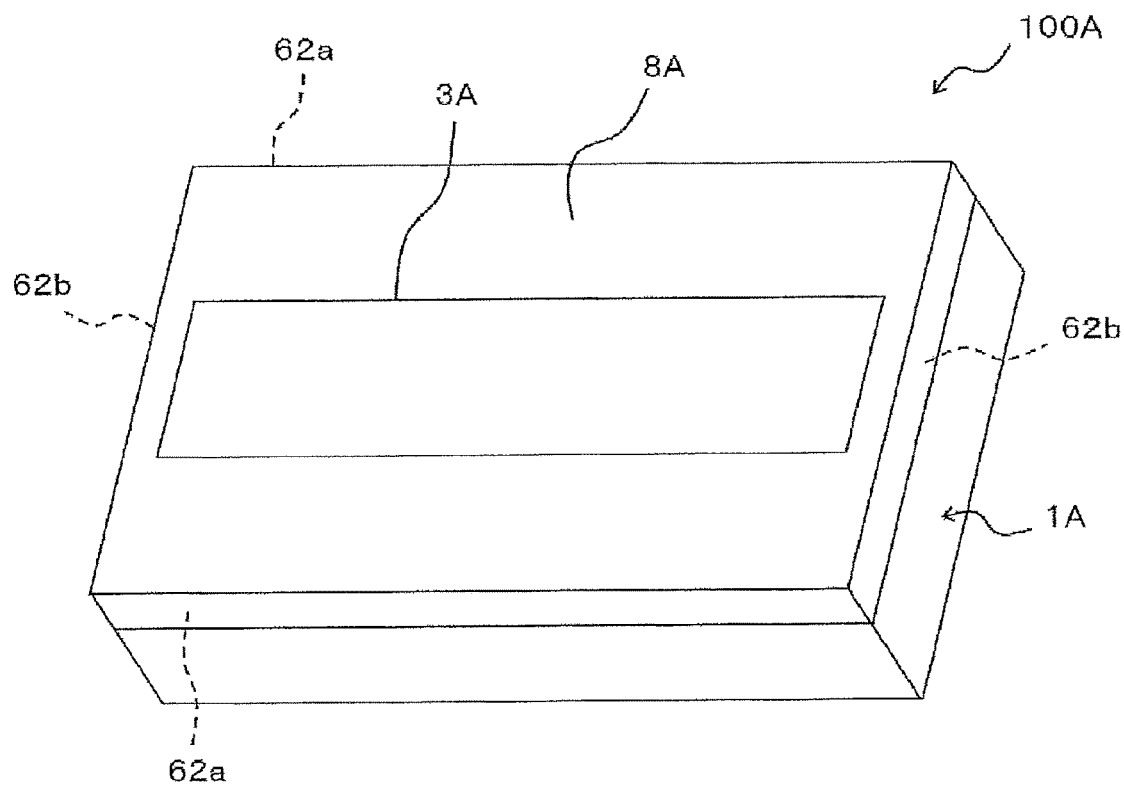
FIG. 11A is a schematic perspective view showing a structure of a light emitting device according to a variant example of the first embodiment.
Figure 11B:
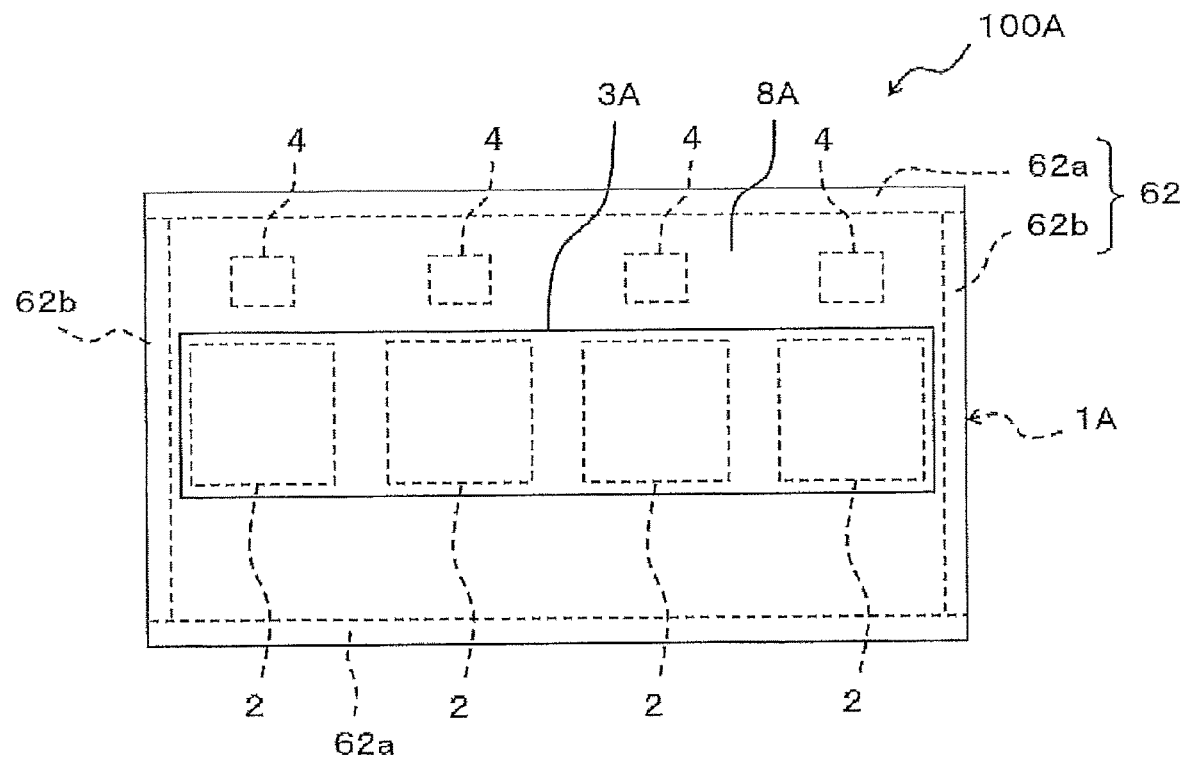
FIG. 11B is a schematic plan view showing a structure of the light emitting device according to a variant example of the first embodiment.

Next, a light emitting device according to a variant example of the first embodiment described above, with reference to FIGS. 11A and 11B. FIG. 11A is a schematic perspective view showing a structure of a light emitting device according to a variant example of the first embodiment. FIG. 11B is a schematic plan view showing the structure of the light emitting device according to a variant example of the first embodiment.

In a light emitting device 100A according to the present variant example, in a plan view, all sides (i.e., four sides) of a rectangular shape of outer peripheries of the cover member 8 are coincided with outer peripheries of a mount substrate 1A. Accordingly, the second protruding member 62 (62a, 62b) is arranged along all the sides of the outer peripheries of the mount substrate 1A.

Further, in the light emitting device 100A according to the present variant example, while the four light emitting elements 2 arranged in a row similarly to the light emitting device 100, one oblong light transmissive member 3A having a size that allows for covering the entire upper surface of each of the four light emitting elements 2 is arranged instead of four light transmissive members 3. In this manner, the light emitting device 100A can include the light emitting elements and the light transmissive member different in number.

As in the present modification, in the case where the external connection portions are not arranged on an upper surface of the mount substrate 1A, the external connection portions of the mount substrate 1A may be arranged, for example, on a rear surface of the mount substrate 1A so as to be exposed. Wiring portions for mounting the light emitting elements 2 and the protective elements 4 may be arranged in the same manner as the mount substrate 1 described above. Further, the wiring portions arranged on the upper surface of the mount substrate 1A may be electrically connected with the external connection portions arranged on the lower surface, for example, via a through hole penetrating the support member in a thickness direction in which a conductive material such as metal is filled for electrical conduction.

The light emitting device 100A according to the modification may be manufactured by altering the method of manufacturing the light emitting device 100 described above as below. In the collective substrate providing step S11, a collective substrate is provided in which the mount substrates 1A having the configuration described above are connected. In the light transmissive member arranging step S13, one light transmissive member 3A is bonded on the upper surface of each of the predetermined number (e.g., four) of light emitting elements 2. In the first protruding member arranging step S141, the first protruding member 61 is arranged to surround an outer side of a region surrounded by the upper end boundary BD1, the lower end boundary BD1, the left end boundary BD3 and the right end boundary BD3 in FIG. 5A. That is, one first protruding member 61 is arranged as an outer frame of a region where the uncured resin material for forming the cover member 8A is supplied. Then, in the second protruding member arranging step S142, the second protruding member 62 is arranged in the region where the first protruding member 61 is arranged, along the boundaries BD1, BD2 and BD3. In other words, the second protruding member 62 is arranged on all the boundaries which demarcate the respective regions for forming the light emitting devices. In the singulating step S17, the cover member 8A, the second protruding member 62 and the mount substrate 1 are cut along the boundaries BD1, BD2 and BD3, so that the light emitting devices 100A is singulated. Other steps are the same as those in the method of manufacturing the light emitting device 100, so that the light emitting device 100A can be manufactured.

Second Embodiment

Configuration of Light Emitting Device

Next, a light emitting device according to a second embodiment is described below with reference to FIGS. 12A and 12B.

Figure 12A:
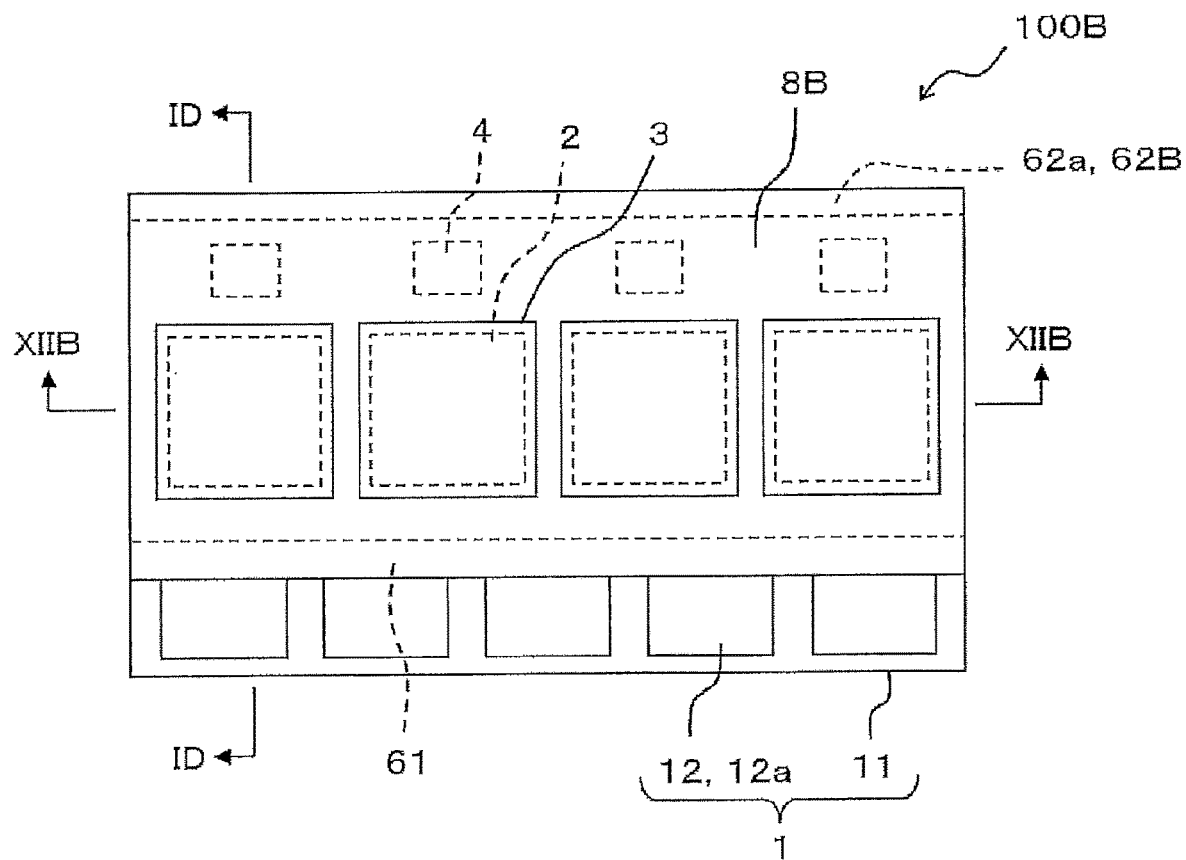
FIG. 12A is a schematic plan view showing a structure of a light emitting device according to a second embodiment.
Figure 12B:
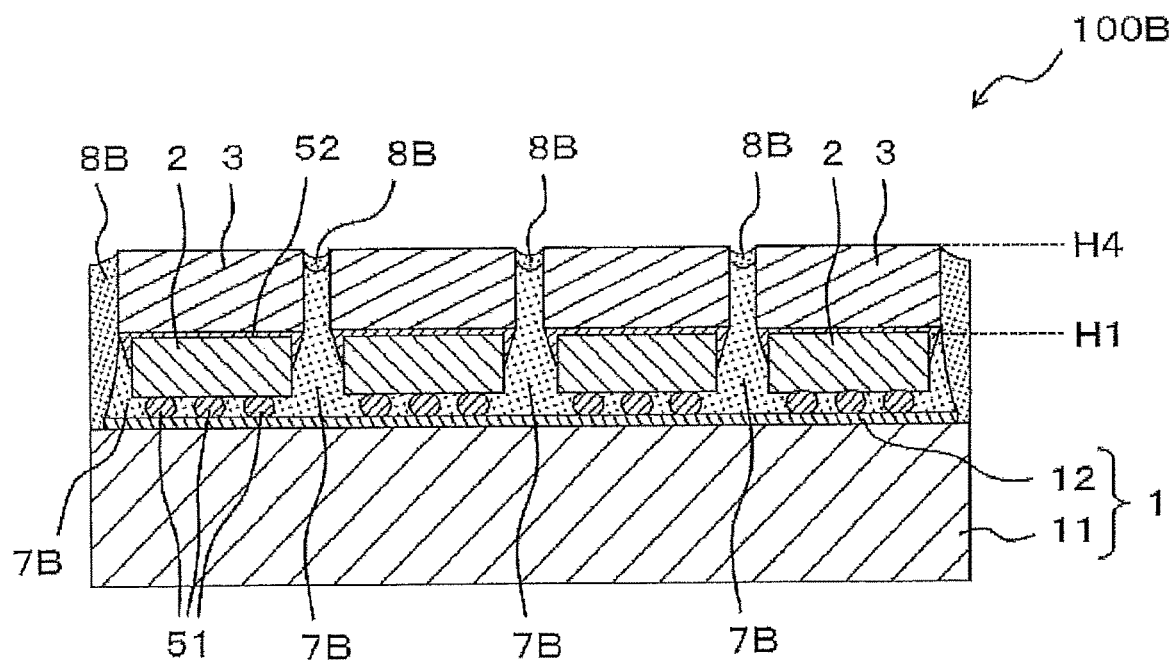
FIG. 12B is a schematic cross-sectional view showing a structure of the light emitting device according to the second embodiment taken along a line XIIB-XIIB in FIG. 12A.

FIG. 12A is a schematic plan view showing a structure of a light emitting device according to the second embodiment. FIG. 12B is a schematic cross-sectional view showing the structure of the light emitting device according to the second embodiment taken along a line XIIB-XIIB in FIG. 12A.

The schematic cross-sectional view taken along a line ID-ID in FIG. 12A is substantially the same as the schematic cross-sectional view of the light emitting device 100 shown in FIG. 1D.

A light emitting device 100B according to the second embodiment is different from the light emitting device 100 according to the first embodiment in that the second protruding member 62b are not arranged at the end portions in the longitudinal direction (i.e., lateral direction in FIG. 12A), an underfill 7B is arranged instead of the underfill 7, and a cover member 8B is arranged instead of the cover member 8. For the underfill 7B and the cover member 8B, the same material as the underfill 7 and the cover member 8 may be used, respectively.

In the second protruding member 62B in the present embodiment, while the second protruding member 62a is disposed at one end in the transverse direction (i.e., vertical direction in FIG. 12A) of the light emitting device 100B, the second protruding members 62b (see FIG. 10) are not arranged at end portions in the lateral direction of the light emitting device 100B.

As described above, the second protruding members 62a, 62b are used to suppress the "sink marks" of resin in the cover member forming step S16 (see FIG. 2) in manufacturing, while the "sink marks" of the resin can be reduced also by narrowing the interval between the light emitting elements 2 and the interval between the light transmissive members 3 even if the second protruding members 62a, 62b are not provided.

In the light emitting device 100B according to the present embodiment, the interval between the light emitting elements 2 and the interval between the light transmissive members 3 arranged across the boundary BD3 (see FIG. 13B) in the lateral direction are narrowed, which allows for omitting the second protruding member 62b.

For example, in the case where the viscosity of resin is in a range of about 1 to 20 Pa·s, the second protruding members 62b may be omitted with the interval between the light transmissive members 3 is approximately smaller than a half of the length of one side of the light transmissive member 3.

More specifically, in order to omit the second protruding members 62b, the interval between the light transmissive members 3 is preferably about 800 μm or smaller, and more preferably in a range of about 400 μm to 600 μm.

The underfill 7B is filled in a space between the upper surface of the mount substrate 1 and the lower surface of each of the light emitting elements 2. The underfill 7B is, between the light emitting elements 2 and between the light transmissive members 3, arranged to a height that allows for covering a portion near the upper end portions of the lateral surfaces of each of the light transmissive members 3. Further, the underfill 7B is arranged to a height that allows for covering a portion near the upper end portions of the lateral surfaces of each of the light emitting elements 2 at end portions in the lateral direction of the light emitting device 100B.

Note that, at the end portions of the light emitting device 100B in the lateral direction, the underfill 7B is filled in the space between the upper surface of the mount substrate 1 and the lower surfaces of the light emitting elements 2, and may be arranged to a height that allows for covering a portion of each of the lateral surfaces of the light emitting elements 2.

The cover member 8B covers the side surface of each of the light emitting elements 2 and the side surface of each of the light transmissive members 3 to seal the light emitting elements 2 together with the underfill 7B. Further, the cover member 8B and the underfill 7B can reduce leak of light from lateral surfaces of one group of the light emitting element 2 and the light transmissive member 3 to lateral surfaces of adjacent group of the light emitting element 2 and the light transmissive member 3. The cover member 8B is arranged so as to be layered on the underfill 7B between the light transmissive members 3, and is arranged to a height that allows for covering approximately the upper end portions of the lateral surfaces of the light transmissive members 3. In the present embodiment, no second protruding member 62b is arranged at the end portions in the lateral direction of the light emitting device 100B, so that the cover member 8B can be arranged from the upper surface of the mount substrate 1 to a height that allows for covering approximately the upper end portions of the side surfaces of the light transmissive members 3 at the end portions in the lateral direction of the light emitting device 100B. At the end portions in the lateral direction of the light emitting device 100B, the underfill 7B may be arranged on the upper surface of the mount substrate 1, and in that case, the cover member 8B is arranged so as to be layered on the underfill 7B.

Further, in the light emitting device 100B according to the present embodiment, the underfill 7B and the cover member 8B are arranged in the region between the first protruding member 61 and the second protruding member 62a at the end portions in the vertical direction, similarly to the underfill 7 and the cover member 8 of the light emitting device 100 according to the first embodiment.

Both the underfill 7B and the cover member 8B are made of a resin material, in which cracks may be generated at a portion in contact with the light emitting elements 2 and the light transmissive members 3 due to light or thermal stress from the light emitting elements 2 and the light transmissive members 3. In particular, portions between the light emitting elements 2 and portions between the light transmissive members 3 are subjected to light and heat from two directions, in which cracks may be generated more easily. In the present embodiment, the underfill 7B provided as a lower layer is arranged to cover the lateral surfaces of the light transmissive members 3 between the light emitting elements 2 and the light transmissive members 3, and the cover member 8B provided as an upper layer is arranged to cover the underfill 7B so as to be in contact with a portion of the light transmissive members 3 near the upper end portions of the light transmissive members 3.

Here, a physical interface is formed between the underfill 7B and the cover member 8B. Therefore, even if a crack is generated in the underfill 7B, the cracks stop at the interface to the cover member 8B, so that generations of cracks in the cover member 8B may be prevented. That is, cracks hardly extend to a surface of the light emitting device 100B, that allows for maintaining a function as a sealing member or a light shielding member formed with the underfill 7B and the cover member 8B.

Further, with underfill 7B and the cover member 8B that are different in light-reflection, an optical interface is formed between the underfill 7B and the cover member 8B near the upper end portions of the light transmissive members 3. Still further, this interface is formed to be curved downward to use the capillary phenomenon for forming the underfill 7B. With this arrangement, light emitted from the side surface of a light transmissive member 3 to pass through the underfill 7B in the lateral direction can be reflected downward at this interface.

That is, the light emitted from the lateral surfaces of one light transmissive member 3 is not easily propagated to an adjacent light transmissive member 3. Therefore, in the case where a plurality of light emitting elements 2 are independently controlled to emit light, this arrangement allows brightness of each light emitting surface to be more independent.

In view of preventing extension of cracks and reducing leaking of light to an adjacent light emitting surface as described above, the underfill 7B preferably covers at least a portion of each of lateral surfaces of adjacent light transmissive members 3 that face each other between the light emitting elements 2 and between the light transmissive members 3, and is more preferably arranged to a height that allows for covering a portion near the upper end portions of the lateral surfaces of the light transmissive members 3. Further, in this arrangement, the interface between the underfill 7B and the cover member 8B is preferably a convex surface curved toward the mount substrate 1.

Further, the underfill 7B is arranged under the light emitting elements 2, between the light emitting elements 2, and between the light transmissive members 3, so that thermal stress is easily generated. Thus, the underfill 7B preferably has lower elasticity (i.e., is softer) than the cover member 8B in order to prevent generation of a crack.

Still further, at the time of cutting by a dicing blade or the like, the lower the resin elasticity is (i.e., the softer the resin is), the more resin burrs are easily formed. The underfill 7B and the cover member 8B arranged near the end portions in the lateral direction of the light emitting device 100B are cut in the singulating step S17 (see FIG. 2). For this reason, the underfill 7B is preferably not arranged near the end portions in the lateral direction, but may be arranged near the end portions in the lateral direction as a thin film, which allows for generating substantially no resin burrs at the time of cutting. Such thin film has a thickness, for example, equivalent to or smaller than that of the wiring 12 of the mount substrate 1, and, more specifically, preferably has a thickness of 10 μm or smaller.

Method of Manufacturing Light Emitting Device

Figure 13A:
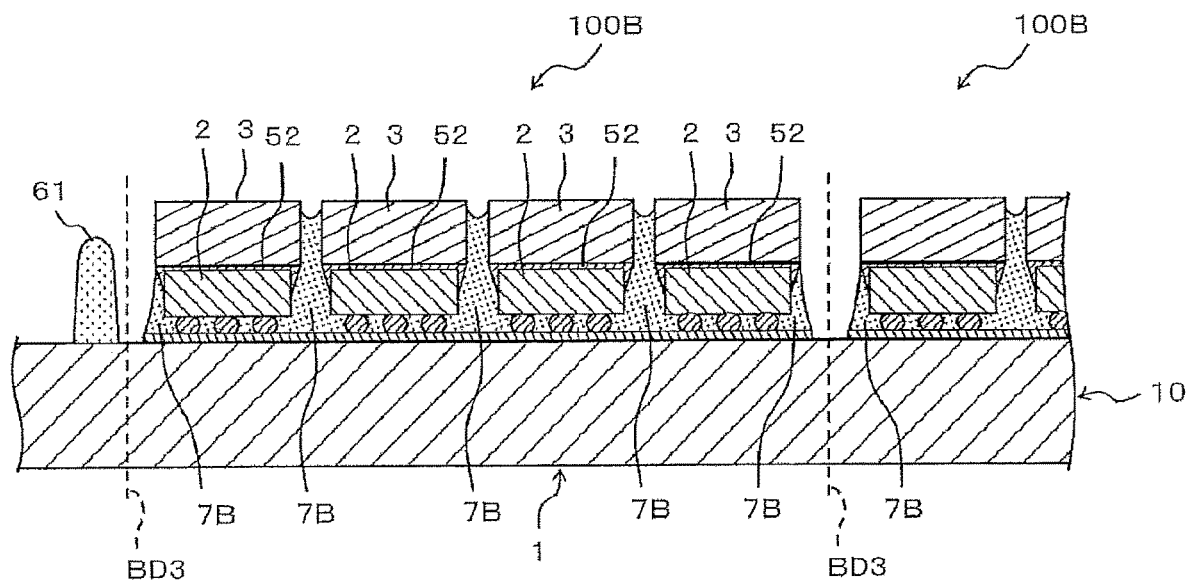
FIG. 13A is a schematic cross-sectional view illustrating an underfill forming step of a method of manufacturing a light emitting device according to the second embodiment taken along line XIIB-XIIB in FIG. 12A at a portion corresponding to line XIIB-XIIB.
Figure 13B:
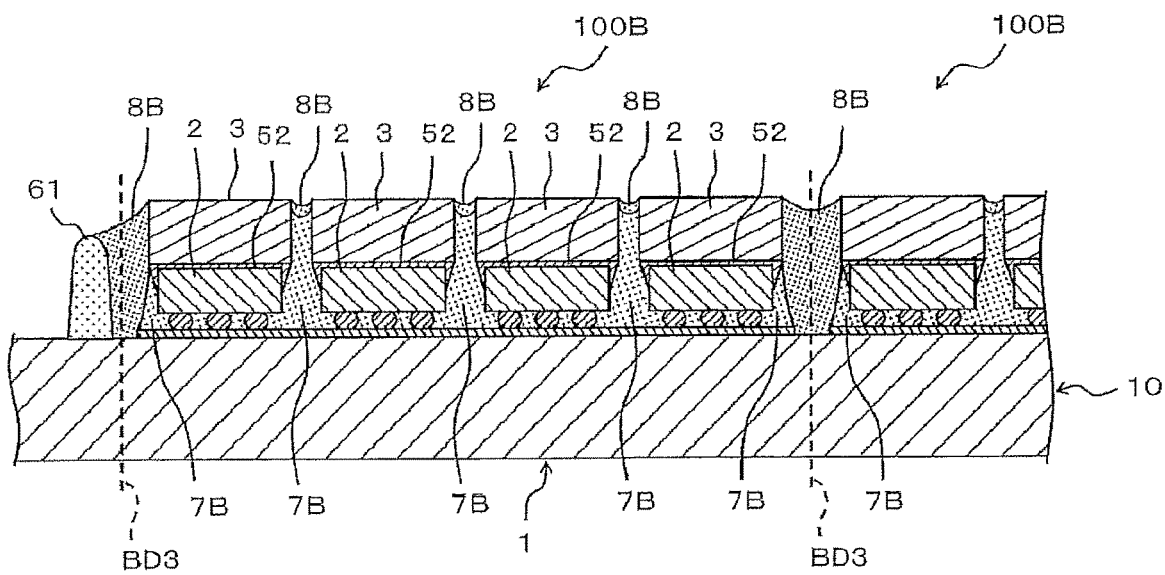
FIG. 13B is a schematic cross-sectional view illustrating a cover member forming step of the method of manufacturing a light emitting device according to the second embodiment taken along line XIIB-XIIB in FIG. 12A at a portion corresponding to line XIIB-XIIB.

Next, a method of manufacturing the light emitting device 100B according to the second embodiment is described with reference to FIGS. 2, 13A and 13B. FIG. 13A is a schematic cross-sectional view illustrating the underfill forming step in the manufacturing method of a light emitting device according to the second embodiment taken along line XIIB-XIIB in FIG. 12A at a portion corresponding to line XIIB-XIIB in FIG. 12A. FIG. 13B is a cross-sectional view illustrating the cover member forming step in the manufacturing method of a light emitting device according to the second embodiment taken along line XIIB-XIIB in FIG. 12A at a portion corresponding to line XIIB-XIIB in FIG. 12A.

The light emitting device 100B according to the second embodiment can be manufactured by altering the method of manufacturing the light emitting device 100 according to the first embodiment shown in FIG. 2 as below. In the light emitting element mounting step S12 and the light transmissive member arranging step S13, the light emitting elements 2 and the light transmissive members 3 across the boundary BD3 are arranged on the collective substrate 10 at an interval which allows the second protruding members 62b to be omitted.

In the protruding member arranging step S14, the first protruding member arranging step S141 and the second protruding member arranging step S142 are performed. In the present embodiment, in the second protruding member arranging step S142, the second protruding member 62a is arranged on the boundary BD2 on the upper surface of the collective substrate 10, while the second protruding member 62b is not arranged on the boundary BD3. Further, in the first protruding member arranging step S141, as shown in FIG. 13A, the first protruding member 61 is arranged so that the light emitting element 2 and the light transmissive member 3 that are arranged at the end portion in the lateral direction of the collective substrate 10 are spaced apart from the first protruding member 61 to allow a space in which an uncured resin for forming the cover member 8 can be suitably filled. The space is almost as large as the space between the light transmissive members 3 across the boundary BD3.

In the underfill forming step S15, an uncured resin as a material for the underfill 7B is filled in a space between the light emitting elements 2 and the collective substrate 10, a space between the light emitting elements 2 and a space between the light transmissive members 3. Supplying an uncured resin adjusted to have appropriate viscosity around the light emitting elements 2 allows the resin to be filled in these spaces up to a position near the upper end portions of the light transmissive members 3 using the capillary phenomenon. At the top region of each of these spaces, a space in which the cover member 8B is to be arranged is left. Then, the resin is cured by a heat treatment, so that the underfill 7B is formed. The underfill forming step S15 is performed before the cover member forming step S16.

The underfill 7B is filled between the light emitting elements 2 and the mount substrate 1, so that thermal stress due to heat from the light emitting elements 2 may be easily generated. For this reason, a resin having lower elasticity, that is, a resin softer than that of the cover member 8B, is preferably used for the underfill 7B in order to prevent generation of a crack. For example, in the case where a Shore A hardness of the cover member 8B after curing is A60, a Shore A hardness of the underfill 7B after curing may be about A50.

On the other hand, the lower the elasticity of the resin is, the more resin burrs are easily formed at the time of cutting by using the dicing method or the like and the less stable a shape of a cut surface is. Therefore, the underfill 7B is preferably not formed on the boundary BD3 that serves as a cutting line. Further, even in the case where the underfill 7B is formed on the boundary BD3, the underfill 7B is preferably formed to be a thin film having almost the same thickness as that of the wiring 12 or smaller as described above. Accordingly, malfunction such as generation of burrs can be prevented.

In the cover member forming step S16, an uncured resin material to be the cover member 8B is supplied in an upper region of each of a space between the light emitting elements 2 and a space between the light transmissive members 3 and in a space across the boundary BD3. Then, the resin is cured by a heat treatment, so that the cover member 8B can be formed.

In the singulating step S17, the cover member 8B, the second protruding members 62b and the collective substrate 10 are cut along the boundary BD2 (see FIG. 10A) and the boundary BD3. The underfill 7B softer than the cover member 8B is not arranged on the boundary BD3, so that the members can be cut into a stable shape. Further, similarly to the first embodiment, the second protruding member 62a harder than the cover member 8B is arranged on the boundary BD2, which allows the members to be cut into a more stable shape. Through the above-described steps, the light emitting devices 100B can be manufactured.

While the light emitting device and the manufacturing method thereof according to the present invention is specifically described using the embodiments according to the present invention, the spirit of the present invention is not limited thereto and should be interpreted broadly based on the appended claims. Further, various modifications and changes based on the descriptions should be, needless to say, included within the spirit of the present invention.

The light emitting device according to the embodiments of the present disclosure may be used for various light sources in various lighting devices such as LED lamps and spotlights, a backlight for a liquid crystal display, a large-type display device, various display devices such as an advertisement and a destination guide, and further, an image reading apparatus such as a digital video camera, a facsimile, a copier and a scanner, and a projector.

Obviously, numerous modifications and variations of the present invention are possible in light of the above teachings. It is therefore to be understood that within the scope of the appended claims, the invention may be practiced otherwise than as specifically described herein.

What is claimed is:

1. A light emitting device comprising:
   a substrate;
   a light emitting element mounted on the substrate;
   a light transmissive member disposed on an upper surface of the light emitting element;
   a covering member covering an upper surface of the substrate, a lateral surface of the light emitting element, and at least a portion of a lateral surface of the light transmissive member such that an upper surface of the light transmissive member is exposed;
   a first protruding member provided on the substrate;
   a second protruding member provided on the substrate such that the light emitting element and the light transmissive member are positioned between the first protruding member and the second protruding member;
   a protective element mounted on the substrate so as to be positioned between the light emitting element and the second protruding member; and
   a light transmissive bonding member provided between the light emitting element and the light transmissive member,
   wherein an outer periphery of the substrate extends from a first end of the substrate to a second end of the substrate opposite to the first end of the substrate in a plan view,
   wherein the second protruding member extends from the first end of the substrate to the second end of the substrate,
   wherein at least a part of an outer periphery of the second protruding member coincides with the outer periphery of the substrate from the first end of the substrate to the second end of the substrate in a plan view,
   wherein the light transmissive bonding member covers at least a portion of a lateral surface of the light emitting element, and
   wherein the covering member covers the lateral surface of the light emitting element via the light transmissive bonding member.

2. The light emitting device according to claim 1, wherein the first protruding member and the second protruding member are parallel to each other.

3. The light emitting device according to claim 1,
   wherein an upper end of the first protruding member is higher than an upper end of the second protruding member, and
   wherein the covering member covers the upper end of the second protruding member.

4. The light emitting device according to claim 1,
   wherein the substrate includes a flat plate-shaped support member and a wiring provided on an upper surface of the support member, and
   wherein a portion of the wiring is exposed from the covering member and the first protruding member.

5. The light emitting device according to claim 1, wherein the second protruding member is harder than the covering member.

6. The light emitting device according to claim 1, wherein the covering member includes light reflecting substance.

7. The light emitting device according to claim 1, wherein the light transmissive members include phosphor.

8. The light emitting device according to claim 1,
   wherein the first protruding member extends from the first end of the substrate to the second end of the substrate.

9. The light emitting device according to claim 1, further comprising:
an additional light emitting element mounted on the substrate such that the light emitting element and the additional light emitting element are arranged in a line along the second protruding member.

10. The light emitting device according to claim 1, further comprising:
an additional protective element mounted on the substrate such that the protective element and the additional protective element are arranged in a line along the second protruding member.

* * * * *